United States Patent [19]

Sakurai

[11] Patent Number: 5,801,596
[45] Date of Patent: Sep. 1, 1998

[54] TEMPERATURE COMPENSATION TYPE QUARTZ OSCILLATOR

[75] Inventor: Yasuhiro Sakurai, Sayama, Japan

[73] Assignee: Citizen Watch Co., Ltd., Tokyo, Japan

[21] Appl. No.: 765,459

[22] PCT Filed: Jul. 27, 1995

[86] PCT No.: PCT/JP95/01501

§ 371 Date: Jan. 23, 1997

§ 102(e) Date: Jan. 23, 1997

[87] PCT Pub. No.: WO96/03799

PCT Pub. Date: Feb. 8, 1996

[30] Foreign Application Priority Data

Jul. 27, 1994 [JP] Japan .................. 6-174652
Nov. 4, 1994 [JP] Japan .................. 6-271033

[51] Int. Cl.[6] .................. H03L 7/00; H03B 5/32
[52] U.S. Cl. .................. 331/176; 331/158
[58] Field of Search .................. 331/176, 158

[56] References Cited

U.S. PATENT DOCUMENTS

| | | | |
|---|---|---|---|
| 4,015,208 | 3/1977 | Hammer et al. | 331/176 |
| 4,415,870 | 11/1983 | Zumsteg | 331/176 |
| 5,530,458 | 6/1996 | Vig et al. | 331/158 |

FOREIGN PATENT DOCUMENTS

| | | |
|---|---|---|
| 53-33667 | 3/1978 | Japan . |
| 61-182111 | 11/1986 | Japan . |
| 62-156853 | 7/1987 | Japan . |
| 63-221704 | 9/1988 | Japan . |
| 2-79603 | 3/1990 | Japan . |
| 2-295302 | 12/1990 | Japan . |
| 3-153068 | 7/1991 | Japan . |
| 3-280605 | 12/1991 | Japan . |
| 4-42958 | 2/1992 | Japan . |
| 4-304704 | 10/1992 | Japan . |

*Primary Examiner*—David C. Nelms
*Assistant Examiner*—Trong Phan
*Attorney, Agent, or Firm*—Armstrong, Westerman, Hattori, McLeland & Naughton

[57] ABSTRACT

A quartz oscillation unit is constituted of a parallel circuit of a quartz oscillator (1), an oscillation inverter (3) and a feedback resistor (5), and a fixed capacitor (15) for temperature compensation and a MOS resistor (17) for temperature compensation are connected in series between one of the terminals of the parallel circuit and a power supply. A fixed capacitor (19) for external frequency control and a MOS resistor (21) for external frequency control are connected in series between the other terminal of the parallel circuit and the power supply. Further, the gate of the temperature compensation MOS resistor (17) is connected to temperature compensation voltage generation unit (4) comprising a temperature information generation section (7), a D/A converter (9) and an integrator (11), and the gate of the external frequency control MOS resistor (21) is connected to an external voltage input terminal (13). In this way is formed a temperature compensation type quartz oscillator. Accordingly, almost all the components of this means can be easily incorporated in a semiconductor integrated circuit.

12 Claims, 6 Drawing Sheets

TEMPERATURE COMPENSATION TYPE QUARTZ OSCILLATOR

DESCRIPTION

1. Technical Field

This invention relates to the structure of a temperature compensation type quartz oscillator, particularly to one suitable for a small digital temperature compensation type quartz oscillator for incorporation in a portable telephone set or the like.

2. Background Technology

Demand is strong for smaller quartz oscillators for incorporation in portable telephone sets, automobile telephone sets and the like. Moreover, while analog temperature compensation type quartz oscillators used to be the main type, digital temperature compensation type quartz oscillators are recently receiving increasing attention for their frequency precision and ease of production.

The frequency regulation method is fundamentally the same in a digital temperature compensation type quartz oscillator as in an analog temperature compensation type quartz oscillator. Specifically, the oscillating frequency is maintained constant by varying the load capacitance of quartz oscillation means in accord with the temperature characteristics of the quartz oscillator or in accord with deviation from a reference frequency from a base station.

Means usable for changing the load capacitance in the temperature compensation operation of a digital temperature compensation type quartz oscillator include means for directly operating switch and capacitor circuity with a digital code and means for converting a digital code to analog voltage by a D/A converter and varying the capacitance value of a variable capacitance diode using this voltage.

It is extremely difficult to vary the load capacitance slowly with the former means using switch and capacitor circuity. Since the frequency compensation of the quartz oscillator therefore occurs abruptly at the time of temperature change, a telephone set using this means has the problem of producing FM noise.

On the other hand, the latter means using the D/A converter is easily able to achieve slow variation of the load capacitance by insertion of an integrating circuit (low-pass filter) between the D/A converter and the variable capacitance diode or by slowing the operation of the D/A converter itself and therefore does not have the problem of producing FM noise.

Because of this, means using a D/A converter and a variable capacitance diode is used in the temperature compensation operation of the ordinary digital temperature compensation type quartz oscillator.

Means using a variable capacitance diode is also used in the case of setting the oscillating frequency to the base station reference frequency, partly for the reason that the external input signal used in the setting operation is an analog signal intended for use with a variable capacitance diode.

FIG. 11 is a circuit diagram showing an example of the structure of a conventional digital temperature compensation type quartz oscillator. In this FIG. 11, the oscillation inverter and the like are designated using circuit symbols and the temperature information generation section and the like using blocks.

As shown in FIG. 11, a quartz oscillator 1, an oscillation inverter 3 and a feedback resistor 5 are connected in parallel to constitute quartz oscillation means 2, and a direct current blocking capacitor 23 for temperature compensation and a variable capacitance diode 25 for temperature compensation are connected in series to constitute temperature compensation control means 6. One terminal of the temperature compensation direct current blocking capacitor 23 is connected to the input terminal of the oscillation inverter 3, the anode of the temperature compensation variable capacitance diode 25 is connected to the other terminal of the temperature compensation direct current blocking capacitor 23, and the cathode of the temperature compensation variable capacitance diode 25 is connected to a high-potential side power supply +Vcc.

A direct current blocking capacitor 27 for external frequency control and a variable capacitance diode 29 for external frequency control are connected in series to constitute an external frequency control means 8. One terminal of the external frequency control direct current blocking capacitor 27 is connected to the output terminal of the oscillation inverter 3, the cathode of the external frequency control variable capacitance diode 29 is connected to the other terminal of the external frequency control direct current blocking capacitor 27, and the anode of the external frequency control variable capacitance diode 29 is connected to a low-potential side power supply.

Temperature compensation voltage generation means 4 for generating digital temperature compensation information is constituted of a temperature information generation section 7, a D/A converter 9 for converting the digital temperature compensation information into an analog voltage, and an integrator 11 for preventing abrupt change in the output of the D/A converter 9. The temperature compensation voltage generation means 4 outputs a voltage for the temperature compensation operation from the integrator 11 and the output terminal thereof is connected to the anode of the temperature compensation variable capacitance diode 25 through a fixed resistor 31 for temperature compensation.

The cathode of the external frequency control variable capacitance diode 29 is connected through an external frequency control fixed resistor 33 to an external voltage input terminal 13 used for setting the oscillating frequency to the reference frequency of a base station.

Since the temperature compensation variable capacitance diode 25 and the external frequency control variable capacitance diode 29 used here are formed by means of epitaxial growth imparted with an impurity concentration gradient, they are difficult to incorporate in a semiconductor integrated circuit from the aspects of compatibility with other circuit elements and of cost. They are therefore ordinarily external components.

Moreover, these variable capacitance diodes measure 3.3 mm×1.6 mm×1.1 mm at the smallest and among the components constituting the digital temperature compensation type quartz oscillator fall among those of particularly large size.

The so-configured conventional digital temperature compensation type quartz oscillator has the problem of being at the limit of miniaturization owing to the variable capacitance diodes and large number of other components other than the semiconductor integrated circuit, and also has the problem of high cost.

This invention was accomplished to overcome these problems and aims at providing a temperature compensation type quartz oscillator which enables miniaturization by incorporating as many components as possible in a semiconductor integrated circuit and is also capable of achieving cost reduction.

DISCLOSURE OF THE INVENTION

For achieving the aforesaid object, this invention configures a temperature compensation type quartz oscillator in the following manner for conducting temperature compensation operation and setting of the oscillating frequency to the reference frequency of a base station.

Specifically, the temperature compensation type quartz oscillator is characterized in that it has quartz oscillation means, temperature compensation control means connected between one terminal of the quartz oscillation means and a power supply, external frequency control means connected between the other terminal of the quartz oscillation means and the power supply, temperature compensation voltage generation means connected to a control terminal of the temperature compensation control means, and an external voltage input terminal connected to a control terminal of the external frequency control means.

Further, in this temperature compensation type quartz oscillator, the temperature compensation control means can be constituted by connecting a fixed capacitor for temperature compensation and a voltage controlled variable resistor for temperature compensation in series between one terminal of the quartz oscillation means and the power supply, and the external frequency control means can be constituted by connecting a fixed capacitor for external frequency control and a voltage controlled variable resistor for external frequency control in series between the other terminal of the quartz oscillation means and the power supply.

In addition, a configuration is preferably adopted wherein the temperature compensation voltage generation means is means which outputs the output voltage of a voltage output type D/A converter as a temperature compensation voltage and applies the temperature compensation voltage to the control terminal of the temperature compensation variable resistor and the voltage input through the external voltage input terminal is applied to the control terminal of the external frequency control variable resistor.

Moreover, in this temperature compensation type quartz oscillator, the temperature compensation fixed capacitor incorporated in the temperature compensation control means can be a two-layer polycrystalline silicon film temperature compensation fixed capacitor and the temperature compensation variable resistor thereof can be a temperature compensation variable MOS resistor.

Further, the external frequency control fixed capacitor incorporated in the external frequency control means can be a two-layer polycrystalline silicon film external frequency control fixed capacitor and the external frequency control variable resistor thereof can be an external frequency control variable MOS resistor.

In addition, a configuration is preferably adopted wherein the temperature compensation voltage generated by the temperature compensation voltage generation means is applied to the control terminal of the temperature compensation variable MOS resistor and voltage input through the external voltage input terminal is applied to the control terminal of the external frequency control variable MOS resistor.

Otherwise, the temperature compensation fixed capacitor incorporated in the temperature compensation control means can be a temperature compensation fixed MOS capacitor whose counter electrode is a high-concentration diffused region and the temperature compensation variable resistor thereof can be a temperature compensation variable MOS resistor.

Further, the external frequency control fixed capacitor incorporated in the external frequency control means can be an external frequency control fixed MOS capacitor whose counter electrode is a high-concentration diffused region and the external frequency control variable resistor thereof can be an external frequency control variable MOS resistor.

In addition, a configuration can be adopted wherein the temperature compensation voltage generated by the temperature compensation voltage generation means is applied to the control terminal of the temperature compensation variable MOS resistor and voltage input through the external voltage input terminal is applied to the control terminal of the external frequency control variable MOS resistor.

In the aforesaid temperature compensation type quartz oscillator, the temperature compensation control means can also be constituted by connecting a temperature compensation variable capacitor and a voltage controlled temperature compensation variable resistor in series between one terminal of the quartz oscillation means and the power supply, and the external frequency control means be constituted by connecting an external frequency control fixed capacitor and a voltage controlled external frequency control variable resistor in series between the other terminal of the quartz oscillation means and the power supply.

In such case, a configuration is adopted wherein the temperature compensation voltage generation means is means which outputs the output voltage of a voltage output type D/A converter as a temperature compensation voltage and applies the temperature compensation voltage to the control terminal of the temperature compensation variable resistor and the voltage input through the external voltage input terminal is applied to the control terminal of the external frequency control variable resistor.

In this temperature compensation type quartz oscillator, preferably the temperature compensation variable capacitor incorporated in the temperature compensation control means is a temperature compensation variable MOS capacitor, the temperature compensation variable resistor incorporated in the temperature compensation control means is a temperature compensation variable MOS resistor, and the external frequency control variable resistor incorporated in the external frequency control means is an external frequency control variable MOS resistor.

In addition, a configuration is preferably adopted wherein the temperature compensation voltage generated by the temperature compensation voltage generation means is applied to the control terminal of the temperature compensation variable MOS resistor and voltage input through the external voltage input terminal is applied to the control terminal of the external frequency control variable MOS resistor.

Otherwise, in the aforesaid temperature compensation type quartz oscillator, the temperature compensation control means can be constituted by connecting a variable capacitor for temperature compensation and a voltage controlled variable resistor for temperature compensation in series between one terminal of the quartz oscillation means and the power supply, and the external frequency control means can be constituted by connecting a variable capacitor for external frequency control and a voltage controlled variable resistor for external frequency control in series between the other terminal of the quartz oscillation means and the power supply.

In such case, a configuration is adopted wherein the temperature compensation voltage generation means is means which outputs the output voltage of a voltage output type D/A converter as a temperature compensation voltage and applies the temperature compensation voltage to the control terminal of the temperature compensation variable resistor and the voltage input through the external voltage input terminal is applied to the control terminal of the external frequency control variable resistor.

In this temperature compensation type quartz oscillator, the temperature compensation variable capacitor incorporated in the temperature compensation control means can be a temperature compensation variable MOS capacitor and the temperature compensation variable resistor thereof can be a temperature compensation variable MOS resistor.

Further, the external frequency control variable capacitor incorporated in the external frequency control means can be an external frequency control variable MOS capacitor and the external frequency control variable resistor thereof can be an external frequency control variable MOS resistor.

In addition, a configuration is preferably adopted wherein the temperature compensation voltage generated by the temperature compensation voltage generation means is applied to the control terminal of the temperature compensation variable MOS resistor and voltage input through the external voltage input terminal is applied to the control terminal of the external frequency control variable MOS resistor.

The temperature compensation type quartz oscillator can also be constituted of quartz oscillation means, temperature compensation control means constituted by connecting a temperature compensation direct current blocking capacitor and a temperature compensation variable capacitor in series between one terminal of the quartz oscillation means and a power supply, external frequency control means constituted by connecting an external frequency control direct current blocking capacitor and an external frequency control variable capacitor in series between the other terminal of the quartz oscillation means and the power supply, temperature compensation voltage generation means which outputs the output voltage of a voltage output type D/A converter as a temperature compensation voltage and has its output terminal connected through a temperature compensation fixed resistor to a connection point between the temperature compensation direct current blocking capacitor and the temperature compensation variable capacitor, and an external voltage input terminal connected through an external frequency control fixed resistor to a connection point between the external frequency control direct current blocking capacitor and the external frequency control variable capacitor.

In this temperature compensation type quartz oscillator, preferably the temperature compensation direct current blocking capacitor incorporated in the temperature compensation control means is a temperature compensation direct current blocking capacitor formed of two layers of polycrystalline silicon film containing high-concentration impurity and the temperature compensation variable capacitor thereof is a temperature compensation variable MOS capacitor.

Further preferably, the external frequency control direct current blocking capacitor incorporated in the external frequency control means is an external frequency control direct current blocking capacitor formed of two layers of polycrystalline silicon film containing high-concentration impurity and the external frequency control variable capacitor incorporated in the external frequency control means is an external frequency control variable MOS capacitor.

Otherwise, the temperature compensation direct current blocking capacitor incorporated in the temperature compensation control means can be a temperature compensation direct current blocking capacitor whose counter electrode is a high-concentration diffused region and the temperature compensation variable capacitor incorporated in the temperature compensation control means can be a temperature compensation variable MOS capacitor whose counter electrode is a low-concentration diffused region.

Further, the external frequency control direct current blocking capacitor incorporated in the external frequency control means can be an external frequency control direct current blocking capacitor whose counter electrode is a high-concentration diffused region and the external frequency control variable capacitor can be an external frequency control variable MOS capacitor whose counter electrode is a low-concentration diffused region.

The temperature compensation type quartz oscillator can also be constituted of quartz oscillation means, temperature compensation control means connected between one terminal of the quartz oscillation means and a power supply, a fixed capacitor connected between the other terminal of the quartz oscillation means and the power supply, and temperature compensation voltage generation means connected to a control terminal of the temperature compensation control means.

In this temperature compensation type quartz oscillator, preferably the temperature compensation control means is constituted by connecting a temperature compensation fixed capacitor and a voltage controlled temperature compensation variable resistor in series and the temperature compensation voltage generation means is means which outputs the output voltage of a voltage output type D/A converter as a temperature compensation voltage and applies the temperature compensation voltage to the control terminal of the temperature compensation variable resistor.

Also preferably, the temperature compensation fixed capacitor incorporated in the temperature compensation control means is a two-layer polycrystalline silicon film temperature compensation fixed capacitor, the temperature compensation variable resistor thereof is a temperature compensation variable MOS resistor, and the fixed capacitor connected between the other terminal of the quartz oscillation means and the power supply is a two-layer polycrystalline silicon film fixed capacitor.

In such case, a configuration is adopted wherein the temperature compensation voltage generated by the temperature compensation voltage generation means is applied to the control terminal of the temperature compensation variable MOS resistor.

Otherwise, the temperature compensation fixed capacitor incorporated in the temperature compensation control means can be a temperature compensation fixed MOS capacitor whose counter electrode is a high-concentration diffused region, the temperature compensation variable resistor can be a temperature compensation variable MOS resistor, and the fixed capacitor connected between the other terminal of the quartz oscillation means and the power supply can be a fixed MOS capacitor whose counter electrode is a high-concentration diffused region.

In such case, a configuration is adopted wherein the temperature compensation voltage generated by the temperature compensation voltage generation means is applied to the control terminal of the temperature compensation variable MOS resistor.

In the aforesaid temperature compensation type quartz oscillator, it is also possible to constitute the temperature compensation control means by connecting a temperature compensation variable capacitor and a voltage controlled temperature compensation variable resistor in series, and constituting the temperature compensation voltage generation means as means which outputs the output voltage of a voltage output type D/A converter as a temperature compensation voltage and applies the temperature compensation voltage to the control terminal of the temperature compensation variable resistor.

As a further variation of the temperature compensation type quartz oscillator, there is provided one having quartz oscillation means, temperature compensation control means constituted by connecting a temperature compensation direct current blocking capacitor and a temperature compensation variable capacitor in series between one terminal of the quartz oscillation means and a power supply, a fixed capacitor connected between the other terminal of the quartz oscillation means and the power supply, and temperature compensation voltage generation means which outputs the output voltage of a voltage output type D/A converter as a temperature compensation voltage and has its output terminal connected through a temperature compensation fixed resistor to a connection point between the temperature compensation direct current blocking capacitor and the temperature compensation variable capacitor.

In this temperature compensation type quartz oscillator, preferably the temperature compensation direct current blocking capacitor incorporated in the temperature compensation control means is a temperature compensation direct current blocking capacitor formed of two layers of polycrystalline silicon film containing high-concentration impurity, the temperature compensation variable capacitor thereof is a temperature compensation variable MOS capacitor, and the fixed capacitor connected between the other terminal of the quartz oscillation means and the power supply is a fixed capacitor formed of two layers of polycrystalline silicon film containing high-concentration impurity.

Otherwise, the temperature compensation direct current blocking capacitor incorporated in the temperature compensation control means can be a temperature compensation direct current blocking capacitor whose counter electrode is a high-concentration diffused region, the temperature compensation variable capacitor thereof can be a temperature compensation variable MOS capacitor whose counter electrode is a low-concentration diffused region, and the fixed capacitor connected between the other terminal of the quartz oscillation means and the power supply can be a fixed MOS capacitor whose counter electrode is a high-concentration diffused region.

In those of the temperature compensation type quartz oscillators according to the invention in which the capacitor in each of the temperature compensation control means and the external frequency control means is a fixed capacitor and a voltage controlled variable resistor is connected in series with the fixed capacitor, the load can be varied by varying the resistance value of the voltage controlled variable resistor, without varying the capacitance value itself.

In those in which the capacitor in each of the temperature compensation control means and the external frequency control means is a MOS capacitor with a variable capacitance value and a voltage controlled variable resistor is connected in series with the variable MOS capacitor, the load capacitance can be varied by varying the resistance value of the voltage controlled variable resistor and simultaneously varying the voltage across the terminal of the variable MOS capacitor to superimpose capacitance value variation.

In addition, the load capacitance can be varied by appropriately selecting the manner of combining gate electrode material with a semiconductor substrate to become the counter electrode of the MOS capacitor, thereby forming a variable MOS capacitor with large capacitance value variability in a desired voltage range, and replacing the conventional variable capacitance diode with this variable MOS capacitor.

The reason why the load capacitance of the quartz oscillation means can be varied by direct connection of a fixed capacitor and a voltage controlled variable resistor as described in the foregoing is as follows.

Specifically, when a capacitor of a certain capacitance value is connected between the quartz oscillation means and the power supply without a resistor, nothing is present to impede charging/discharging of the capacitor, so that the capacitor is completely charged/discharged within the oscillation period of the quartz oscillation means, i.e., the connected capacitor functions according to its capacitance value.

When a resistor is connected in series with the capacitor, the resistor impedes charging/discharging so that discharging starts before charging is completely finished and charging starts before the discharging is completely finished.

This condition means that the amount of charge/discharge during the oscillation period of the quartz oscillator decreases and is electrically equivalent to connecting a capacitor of a smaller capacitance value without a resistor.

The charge/discharge rate is determined by the product of the resistance value of the connected resistor and the capacitance value of the connected capacitor. Even if the capacitance value is fixed, therefore, the amount of charge/discharge can be varied by using a voltage controlled variable resistor as the connected resistor and regulating the resistance value using an external voltage.

In other words, connecting a series connection of a fixed capacitor and a voltage controlled variable resistor to the quartz oscillation means is electrically equivalent to connecting a variable capacitor to the quartz oscillation means. This is the reason why the load capacitance of the quartz oscillation means can be varied.

The resistance value of the voltage controlled variable resistor does not have to be constant throughout the charge/discharge period. Even if the resistance value of the voltage controlled variable resistor varies when the voltage across the terminals thereof varies during charge/discharge, the amount of charge/discharge can be varied using an external voltage insofar as the center value of the voltage change can be controlled by an external voltage.

Moreover, the range of load capacitance variability by a voltage controlled variable resistor can be expanded by changing the fixed capacitor to a variable MOS capacitor and connecting the variable MOS capacitor in the direction causing the capacitance value to increase with larger potential difference between the terminals.

In other words, when the load capacitance is to be increased, the resistance value of the voltage controlled variable resistor is decreased. In this state, most of the voltage acting on the series connection of the voltage controlled variable resistor and the variable MOS capacitor acts on the variable MOS capacitor, whereby the potential difference across the terminals of variable MOS capacitor increases.

When this is the state, if the connection is made such that the capacitance value of the variable MOS capacitor increases to about the same size as a fixed capacitor, the load capacitance can be made the same as in the case where a fixed capacitor and a voltage controlled variable resistor are connected in series.

On the other hand, when the load capacitance is to be decreased, the resistance value of the voltage controlled variable resistor is increased. In this state, most of the voltage acting on the series connection of the voltage controlled variable resistor and the variable MOS capacitor acts on the voltage controlled variable resistor, whereby the potential difference across the terminals of the variable MOS capacitor decreases.

When this is the state, if the variable MOS capacitor is connected in the direction in which the capacitance value of the variable MOS capacitor decreases, the load capacitance can be made smaller than in the case where a fixed capacitor and a voltage controlled variable resistor are connected in series.

In other words, by matching the direction of the voltage change of the variable MOS capacitor with the change in the load capacitance produced by the voltage controlled variable resistor and superimposing it thereon, the range of load capacitance variation can be made larger than in the case of connecting a fixed capacitor and a voltage controlled variable resistor in series.

The type of voltage controlled variable resistor is not particularly limited in either of these cases. However, a MOS resistor is further advantageous from the points that it can be easily incorporated into a semiconductor integrated circuit, that it enables the temperature compensation voltage generation means used in the conventional digital temperature compensation type quartz oscillator to be used with little modification, and that it can also be connected without modification to the external voltage input terminal for setting the oscillating frequency to the reference frequency of a base station.

While the circuitry of the last-indicated temperature compensation type quartz oscillator is the same as the prior art, its replacement of the variable capacitance diode with the variable MOS capacitor enables it to achieve incorporation of almost all components other than the quartz oscillator in a semiconductor integrated circuit.

BEST MODE FOR CARRYING OUT THE INVENTION

Embodiments of the invention are explained using the drawings in the following.

[First Embodiment]

Figure 1:
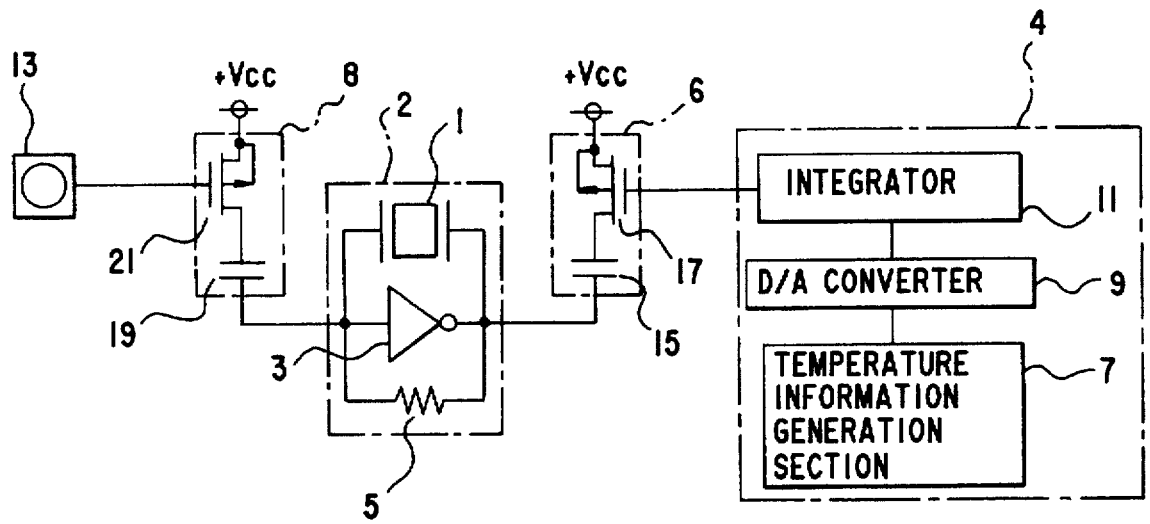
FIG. 1 is a circuit diagram showing the structure of a temperature compensation type quartz oscillator that is a first embodiment of the invention.

FIG. 1 is a circuit diagram showing the structure of a temperature compensation type quartz oscillator that is a first embodiment of this invention. In FIG. 1, the oscillation inverter and the like are designated using circuit symbols and the temperature information generation section and the like using blocks.

This temperature compensation type quartz oscillator is a digital temperature compensation type quartz oscillator with quartz oscillation means 2 constituted by connecting in parallel a quartz oscillator 1, an oscillation inverter 3 and a feedback resistor 5. In addition, temperature compensation control means 6 is constituted by connecting in series a temperature compensation fixed capacitor 15 formed of two layers of polycrystalline silicon film containing high-concentration impurity and a temperature compensation MOS resistor 17 of p-channel MOS resistance type. The temperature compensation control means 6 is connected between the output terminal of the oscillation inverter 3, which constitutes one terminal of the quartz oscillation means 2, and the high-potential side power supply +Vcc so that the temperature compensation MOS resistor 17 is on the power supply side.

External frequency control means 8 is constituted by connecting in series an external frequency control fixed capacitor 19 formed of two layers of polycrystalline silicon film containing high-concentration impurity and an external frequency control MOS resistor 21 of p-channel MOS resistance type. The external frequency control means 8 is connected between the input terminal of the oscillation inverter 3 and the high-potential side power supply +Vcc so that the external frequency control MOS resistor 21 is on the power supply side.

4 is temperature compensation voltage generation means and is constituted of a temperature information generation section 7 for generating digital temperature compensation information, a voltage output type D/A converter 9 for converting this digital temperature compensation information into an analog voltage, and an integrator 11 for preventing abrupt change in the output of the voltage output type D/A converter 9.

This temperature compensation voltage generation means 4 outputs the output voltage of the voltage output type D/A converter 9 as a voltage for temperature compensation operation and the output terminal of thereof, i.e., the output terminal of the integrator 11, is connected to the gate, i.e. control terminal, of the temperature compensation MOS resistor 17.

The gate, i.e., control terminal, of the external frequency control MOS resistor 21 is connected to an external voltage input terminal 13.

A MOS resistor is a voltage control variable resistor whose resistance value varies with gate voltage. Since the temperature compensation MOS resistor 17 is a p-channel MOS resistor, its source and substrate are connected to the high-potential side power supply +Vcc so that its resistance value increases when the gate voltage increases and the potential difference between the gate and the source decreases and its resistance value decreases when the gate voltage decreases and the potential difference between the gate and source increases.

When the resistance value of the temperature compensation MOS resistor 17 is low, charging/discharging of the temperature compensation fixed capacitor 15 is substantially unimpeded and, therefore, charge/discharge is completely finished within the oscillation period of the quartz oscillator 1, i.e., the temperature compensation fixed capacitor 15 functions according to its capacitance value.

When the resistance value of the temperature compensation MOS resistor 17 is high, this resistor impedes charging/discharging of the temperature compensation fixed capacitor 15 so that discharging starts before charging is completely finished and charging starts before the discharging is completely finished.

This condition means that the amount of charge/discharge during the oscillation period of the quartz oscillator 1 decreases and is electrically equivalent to connecting a temperature compensation fixed capacitor 15 of a smaller capacitance value directly to the high potential side.

The charge/discharge rate of the temperature compensation fixed capacitor 15 is determined by the product of the resistance value of the temperature compensation MOS resistor 17 and the capacitance value of the temperature compensation fixed capacitor 15. Even if the capacitance value of the temperature compensation fixed capacitor 15 is fixed, therefore, the amount of charge/discharge can be varied by regulating the resistance value of the temperature compensation MOS resistor 17.

In other words, connecting the series connection of the temperature compensation fixed capacitor 15 and the temperature compensation MOS resistor 17 between the quartz oscillation means 2 and the power supply is electrically equivalent to connecting a variable capacitor between the quartz oscillation means 2 and the power supply. This is the reason why the load capacitance of the quartz oscillation means can be varied.

Specifically, using the gate voltage of the temperature compensation MOS resistor 17 to vary the resistance value thereof is electrically equivalent to varying the capacitance value connected to the output terminal of the oscillation inverter 3 and enables the load capacitance to be varied to temperature-compensate the oscillating frequency.

Strictly speaking, the resistance value of the temperature compensation MOS resistor 17 is varied by varying the voltage between the source and drain, and since the source-drain voltage varies from instant to instant in the course of charging/discharging of the temperature compensation fixed capacitor 15, the charging/discharging also varies from instant to instant.

Since the change in the resistance value of the temperature compensation MOS resistor 17 produced by change in the source-drain voltage is gradual, however, it does not produce quantum changes in the charge/discharge time constant of the temperature compensation fixed capacitor 15, so that the charge/discharge time constant of the temperature compensation fixed capacitor 15 is in the main under the control of the gate voltage of the temperature compensation MOS resistor 17.

Similarly, using the gate voltage of the external frequency control MOS resistor 21 to vary the resistance value thereof is electrically equivalent to varying the capacitance value connected to the input terminal of the oscillation inverter 3 and enables the load capacitance to be varied to set the oscillating frequency to the reference frequency of a base station.

In the configuration of the digital temperature compensation type quartz oscillator shown in FIG. 1, no path passing direct current is present in either the temperature compensation control means 6 or the external frequency control means 8 and only alternating current associated with charging and discharging arises.

This alternating current is a current which occurs not only in this invention but inevitably in any case where the frequency of the quartz oscillation means 2 is controlled by a capacitor and is not a current increase owing to the configuration of this first embodiment of the invention.

In the configuration of the digital temperature compensation type quartz oscillator shown in FIG. 1, temperature compensation operation is conducted by the temperature compensation MOS resistor 17 on the output terminal side of the oscillation inverter 3 and the operation of setting the oscillating frequency to the reference frequency of a base station is conducted by the external frequency control MOS resistor 21 on the input terminal side of the oscillation inverter 3.

Figure 11:
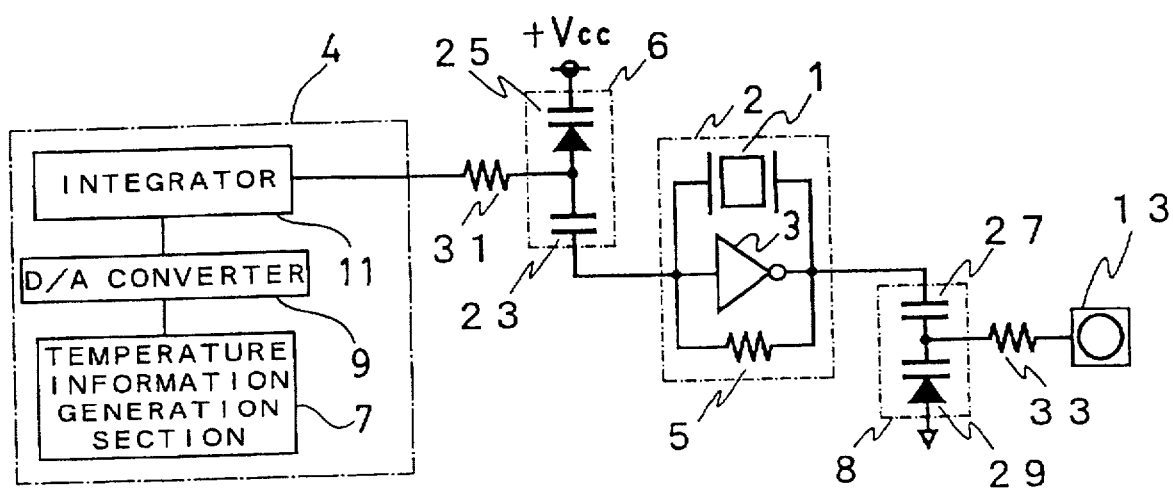
FIG. 11 is a circuit diagram showing the structure of a conventional digital temperature compensation type quartz oscillator.

This is reverse from the configuration of the conventional digital temperature compensation type quartz oscillator shown in FIG. 11. The reason is as follows.

In a digital temperature compensation type quartz oscillator, the frequency regulation range required for temperature compensation operation is generally around 20–40 ppm (part per million), while the frequency regulation range required for the operation of setting the oscillating frequency to the reference frequency of the base station is not more than 10 ppm.

Therefore, in the case of using the same frequency regulating means on both terminals of the oscillation inverter 3, the ordinary practice has been to use the side of large frequency change for the temperature compensation operation and to use the side of small frequency change for the operation of setting the oscillating frequency to the reference frequency of the base station.

In a configuration which directly varies the capacitance value using a variable capacitance diode or other such variable capacitance element, as in the case of the conventional digital temperature compensation type quartz oscillator shown in FIG. 11, the input terminal side of the oscillation inverter 3 is used for the temperature compensation operation since it is generally known that the input terminal side of the oscillation inverter 3 has about twice the frequency variability range of the output terminal side.

In contrast, in the configuration of the first embodiment of this invention using a series connection of a fixed capacitor and a MOS resistor, the frequency variability range on the output terminal side of the oscillation inverter 3 is about twice as large as that on the input terminal side. This is shown by test data below.

Figure 2:
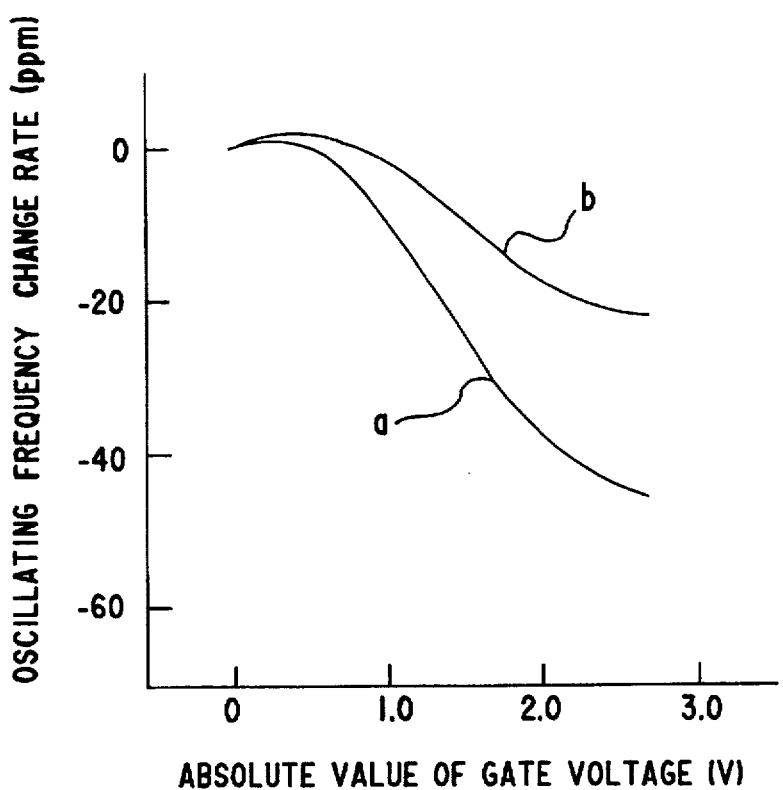
FIG. 2 is a graph showing the characteristics of quartz oscillation means of a temperature compensation type quartz oscillator that is an embodiment of the invention.

FIG. 2 is a graph showing the relationship between absolute value of gate voltage and rate of oscillating frequency change for the p-channel MOS resistance temperature compensation MOS resistor 17 and the external frequency control MOS resistor 21 of the digital temperature compensation type quartz oscillator shown in FIG. 1.

The capacitance values of the temperature compensation fixed capacitor 15 and the external frequency control fixed capacitor 19 were both 30 pF, the channel lengths and channel widths of the temperature compensation MOS resistor 17 and the external frequency control MOS resistor 21 were all 30 μm, absolute values of the threshold voltages of the temperature compensation MOS resistor 17 and the external frequency control MOS resistor 21 were both 0.7 V, and the fundamental frequency of the quartz oscillator 1 was 12.8 MHz.

As shown in FIG. 2, the rate of change a of the oscillating frequency on the output terminal side of the oscillation inverter 3 and the rate of change b of the oscillating frequency on the input terminal side of the oscillation inverter 3 both show a sharp change in frequency from the region where the absolute value of the gate voltage exceeds the threshold voltage value of 0.7 V, and there is a common tendency for the oscillating frequency change to saturate somewhat from the vicinity of an absolute gate voltage value of 2 V. However, the absolute value of the rate of frequency change on the output terminal side of the oscillation inverter 3 is about twice that on the input terminal side of the oscillation inverter 3.

The reason for the occurrence of this phenomenon is thought to be related to the fact that the large amplitude on the output terminal side of the oscillation inverter 3 causes the potential of the counter electrode of the temperature compensation fixed capacitor 15 to exceed the power supply voltage owing to the voltage-increase circuit principle, thus putting the drain of the temperature compensation MOS resistor 17 in the forward direction relative to the substrate.

This is why, as shown in FIG. 1, the output terminal side of the oscillation inverter 3 is used for temperature compensation operation and the input terminal side thereof is used for the operation of setting the oscillating frequency to the reference frequency of the base station.

However, it is also possible, although somewhat disadvantageous, to use the input terminal side of the oscillation inverter 3 for temperature compensation operation and the output terminal side thereof for the operation of setting the oscillating frequency to the reference frequency of the base station.

The capacitance value of the temperature compensation fixed capacitor 15 in FIG. 1 is required to be of a magnitude enabling compensation for change in the oscillating frequency of the quartz oscillator 1 with temperature. Calculations and tests show that insofar as an ordinary AT cut quartz oscillator is used as the quartz oscillator 1, around 30–50 pF or lower suffices.

A two-layer polycrystalline silicon film capacitor with a capacitance value of a magnitude on this level can be fabricated to occupy not more than 200 μm×300 μm of surface area in a semiconductor integrated circuit, although this will increase or decrease somewhat depending on the drivability setting of the oscillation inverter 3. It can therefore be readily incorporated in a semiconductor integrated circuit.

While the resistance values of the temperature compensation MOS resistor 17 and the external frequency control MOS resistor 21 are directly proportional to channel length inversely proportional to channel width and also of course vary with the source-drain voltage, their dependence on the applied gate voltage is predominant, so that variation with gate voltage is possible from large values of 1 GΩ and higher to small values of 100 Ω and lower.

When the resistance value of the temperature compensation MOS resistor 17 is 1 GΩ or greater, the charge/discharge time constant for a temperature compensation fixed capacitor 15 of around 30–50 pF becomes not less than 30–50 msec. Since the oscillation period of an ordinary digital temperature compensation type quartz oscillator is about 50–100 nsec, almost no charging/discharging occurs within the oscillation period. This is substantially equivalent to the state when no temperature compensation fixed capacitor 15 is connected to the oscillation inverter 3.

On the other hand, when the resistance value of the temperature compensation MOS resistor 17 is 100 ohm or less, the charge/discharge time constant for a temperature compensation fixed capacitor 15 of around 30–50 pF becomes not more than 3–5 nsec, so that charge/discharge in substantially completed within the oscillation period. This is substantially equivalent to the state when the temperature compensation fixed capacitor 15 is connected to the power supply directly, not through the temperature compensation MOS resistor 17.

Therefore, by using gate voltage to vary the resistance value of the temperature compensation MOS resistor 17, the capacitance value connected to the output terminal side of the oscillation inverter 3 can be substantially varied 30–50 pF.

Since this degree of capacitance value variation enables the oscillating frequency to be varied about 30–40 ppm, it then suffices to configure the temperature information generation section 7 to generate data matched to the temperature characteristics of the quartz oscillator 1 for compensating the same. For example, means for writing temperature compensation data to a nonvolatile memory incorporated in the temperature information generation section 7 suffices.

Since the operation of setting the oscillating frequency to the reference frequency of the base station is generally subject to a designation that the frequency change is to be positive in polarity with respect to the external input voltage, the voltage controlled variable resistor used has to be one whose resistance value increases in response to increasing external input voltage.

Therefore, insofar as a MOS resistor is used as the voltage controlled variable resistor, the external frequency control MOS resistor 21 on the input terminal side of the oscillation inverter 3 must, as shown in FIG. 1, be a p-channel MOS resistor and cannot be an n-channel MOS resistor. If it is a p-channel MOS resistor, the resistance value increases and the effective load capacitance decreases with increasing external input voltage. Since the oscillating frequency therefore rises, the polarity of the operation is positive. On the other hand, in the case of temperature compensation operation, since it makes no difference whether the polarity of oscillating frequency change is positive or negative with respect to change in the output voltage of the temperature compensation voltage generation means 4, the variable resistor connected to the output terminal side of the oscillation inverter 3 can be an n-channel MOS resistor.

In such case, however, it is advantageous to make the connection with the power supply on the low-potential side of in order to eliminate the influence of the back gate effect.

In the operation of setting the oscillating frequency to the reference frequency of the base station, the required frequency variation range is, roughly, not more than 10 ppm, more particularly, about 3–5 ppm per 1 V change in external voltage change.

Since the capacitance value of the external frequency control fixed capacitor 19 needed for producing this degree of frequency change has been found by actual measurement ordinarily to be no more than 15–30 pF, the area occupied within the semiconductor integrated circuit is not more than 100 μm×300 μm.

Since the digital temperature compensation type quartz oscillator shown in FIG. 1 enables everything but the quartz oscillator 1 to be readily incorporated in a semiconductor integrated circuit, it is obviously able to achieve both more compact size through reduction of number of components and lower cost.

The digital temperature compensation type quartz oscillator of the first embodiment of the invention shown in FIG. 1 has the temperature compensation fixed capacitor 15 and the external frequency control fixed capacitor 19 connected to the oscillation inverter 3 and the temperature compensation MOS resistor 17 and the external frequency control MOS resistor 21 connected to the high-potential side power supply.

However, this can be modified to connect the drain of the temperature compensation MOS resistor 17 to the output terminal of the oscillation inverter 3, connect the drain of the external frequency control MOS resistor 21 to the input terminal of the oscillation inverter 3, connect one terminal of the temperature compensation fixed capacitor 15 to the source of the temperature compensation MOS resistor 17, connect one terminal of the external frequency control fixed capacitor 19 to the source of the external frequency control MOS resistor 21, and connect the other terminal of the temperature compensation fixed capacitor 15 and the other terminal of the external frequency control fixed capacitor 19 to the high-potential side power supply.

Owing to the fact that the drains of the temperature compensation MOS resistor 17 and the external frequency control MOS resistor 21 include extraneous floating capacitance known as pn-junction capacitance as well as to other factors, however, degradation of oscillation activation property and other problems are more likely when the drains of the temperature compensation MOS resistor 17 and the external frequency control MOS resistor 21 are connected to the oscillation inverter 3 than when the temperature compensation fixed capacitor 15 and the external frequency control fixed capacitor 19 are connected to the oscillation inverter 3. Because of this, it is advantageous to connect the temperature compensation fixed capacitor 15 and the external frequency control fixed capacitor 19 to the oscillation inverter 3 as shown in FIG. 1.

Although the temperature compensation fixed capacitor 15 and the external frequency control fixed capacitor 19 are both capacitors formed of two layers of polycrystalline silicon film containing high-concentration impurity, these capacitors can of course be of any type insofar as their capacitance values are not voltage dependent in the voltage range used and, moreover, that they can be easily incorporated in a semiconductor integrated circuit.

Capacitors meeting these conditions include MOS capacitors having an arbitrary conductor such as polycrystalline silicon film, high-melting-point metal film, high-melting-point metal silicide film or the like as the gate electrode and a high-concentration diffused region as the counter electrode.

When the counter electrode is a high-concentration diffused region, almost no depletion layer is formed by the electric field from the gate electrode in the ordinarily used power supply voltage range and the capacitance value therefore does not depend on voltage.

This type of MOS capacitor can therefore be used as the temperature compensation fixed capacitor 15 or the external frequency control fixed capacitor 19 shown in FIG. 1.

However, the counter electrode of the MOS capacitor used as the temperature compensation fixed capacitor 15 or the external frequency control fixed capacitor 19 must be electrically isolated from its surroundings by use of a pn junction. Because of this, connecting this counter electrode to the oscillation inverter 3 involves the disadvantage of impairing the activation property. It is therefore better to connect the gate electrode to the oscillation inverter 3.

The counter electrode consisting of a high-concentration diffused region can be easily formed by introducing high-concentration impurity under the gate insulating film.

For example, in the case of introducing boron as the high-concentration impurity, it suffices to conduct ion implantation after formation of the gate insulating film, while in the case of introducing phosphorus, arsenic or the like as the high-concentration impurity, it suffices to conduct ion implantation before formation of the gate insulating film.

Even in the case of using capacitors with voltage-dependent capacitance values as the temperature compensation fixed capacitor 15 and the external frequency control fixed capacitor 19, the capacitors can of course be considered to be fixed capacitors so long as their capacitance values are not voltage dependent in the voltage range used.

Therefore, even a MOS capacitor whose capacitance value is voltage dependent owing to the counter electrode being a low-concentration diffused region can be made usable as either of the fixed capacitors in FIG. 1 through selection of the work function between the gate electrode and the substrate constituting its counter electrode, and the manner of connection thereof.

Figure 3:
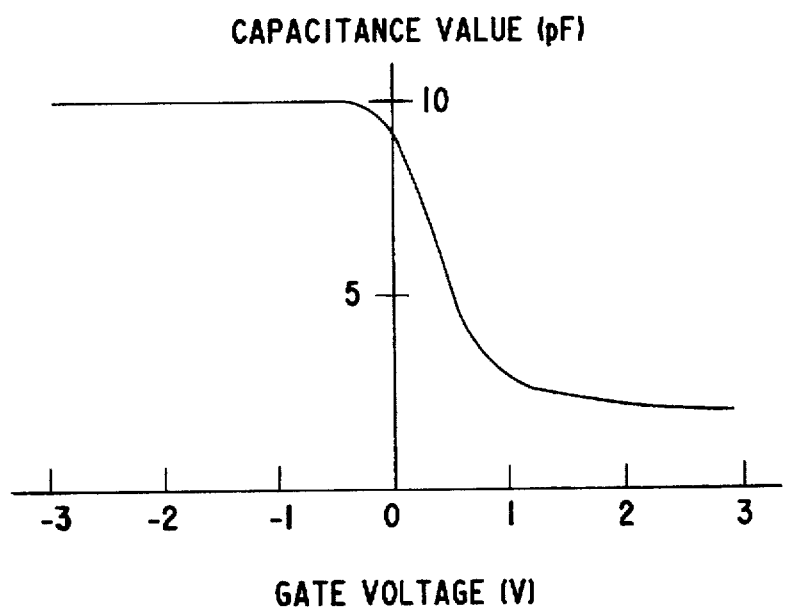
FIG. 3 is a graph showing the C-V characteristics of a MOS capacitor in an embodiment of the invention.

FIG. 3 shows the relationship (the so-called C-V characteristics) between gate voltage and capacitance value, using the counter electrode as reference potential, in a MOS capacitor whose gate electrode is a p-type polycrystalline silicon film and whose counter electrode is a p-type diffused region. Although FIG. 3 is an example for the case of a measurement frequency of 1 MHz, these C-V characteristics do not change even when the frequency is in the 10 MHz band.

As shown in FIG. 3, the MOS capacitor whose gate electrode is a p-type polycrystalline silicon film and whose counter electrode is a p-type diffused region exhibits almost no capacitance value voltage dependence so long as the gate electrode is at a lower potential than the counter electrode and can be considered to be substantially a fixed capacitor so long as used under the condition of this potential relationship.

Figure 4:
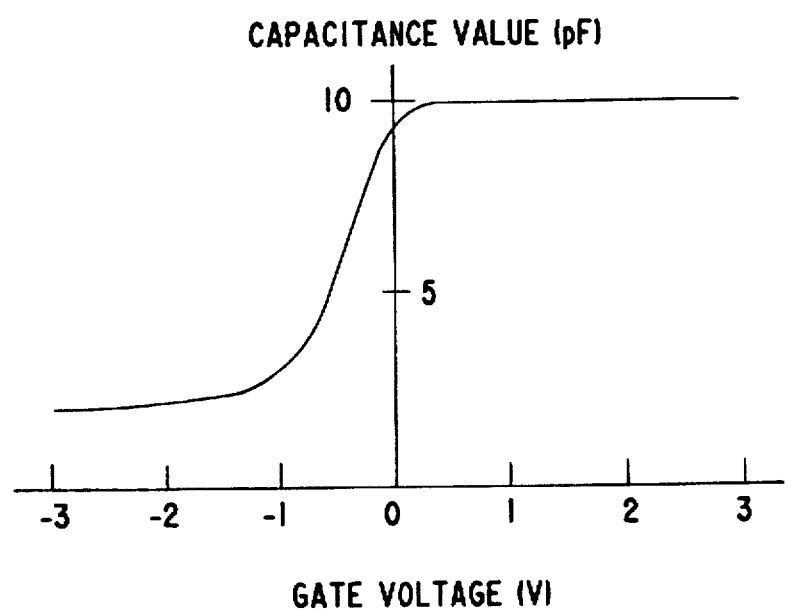
FIG. 4 is a graph showing the C-V characteristics of a MOS capacitor in another embodiment of the invention.

FIG. 4 shows C-V characteristics indicating the relationship between gate voltage and capacitance value, using the counter electrode as reference potential, in a MOS capacitor whose gate electrode is an n-type polycrystalline silicon film and whose counter electrode is an n-type diffused region. Although FIG. 4 is an example for the case of a measurement frequency of 1 MHz, these C-V characteristics do not change even when the frequency is in the 10 MHz band.

As shown in FIG. 4, the MOS capacitor whose gate electrode is an n-type polycrystalline silicon film and whose counter electrode is an n-type diffused region exhibits almost no capacitance value voltage dependence so long as the gate electrode is at a higher potential than the counter electrode and can be considered to be substantially a fixed capacitor so long as used under the condition of this potential relationship.

In the configuration of the digital temperature compensation type quartz oscillator shown in FIG. 1, the output terminal of the oscillation inverter 3 is constantly at a low potential relative to the connection point between the temperature compensation fixed capacitor 15 and the temperature compensation MOS resistor 17, and the input terminal of the oscillation inverter 3 is constantly at a low potential relative to the connection point between the external frequency control fixed capacitor 19 and the external frequency control MOS resistor 21.

A MOS capacitor can therefore be used as a fixed capacitor by replacing the temperature compensation fixed capacitor 15 and the external frequency control fixed capacitor 19 with a temperature compensation fixed MOS capacitor and an external frequency control fixed MOS capacitor whose gate electrodes are p-type polycrystalline silicon films and whose counter electrodes are p-type diffused regions and connecting the gate electrodes respectively to the output terminal and input terminal of the oscillation inverter 3.

Otherwise, a MOS capacitor can be used as a fixed capacitor by replacing the temperature compensation fixed capacitor 15 and the external frequency control fixed capacitor 19 with a temperature compensation fixed MOS capacitor and an external frequency control fixed MOS capacitor whose gate electrodes are n-type polycrystalline silicon films and whose counter electrodes are n-type diffused regions and connecting the counter electrodes respectively to the output terminal and input terminal of the oscillation inverter 3.

By these ways it becomes possible to use MOS capacitors, which are the highest in processing precision among the capacitors which can be incorporated in a semiconductor integrated circuit, as the fixed capacitors in the temperature compensation type quartz oscillator according to this invention.

When a MOS capacitor which uses the counter electrode at a potential different from the power supply voltage is formed on an ordinary semiconductor substrate, however, the counter electrode must be electrically isolated from its surroundings by use of a pn junction. As a result, inclusion of extraneous floating capacitance known as pn-junction capacitance and other such problems arise.

Connecting the counter electrode of a MOS capacitor to the oscillation inverter 3 therefore degrades the oscillation activation property to below that in the case of connecting the gate electrode of the MOS capacitor to the oscillation inverter 3, and this and other problems lead to disadvantages in terms of performance.

In the case of a digital temperature compensation type quartz oscillator constituted with a fixed capacitor and a MOS resistor connected in series with the high-potential side power supply as shown in FIG. 1, therefore, it is advantageous when a MOS capacitor is used as the fixed capacitor to use a MOS capacitor whose gate electrode is a p-type polycrystalline silicon film and whose counter electrode is a p-type diffused region.

When the MOS capacitor is not formed on an ordinary semiconductor substrate but is formed using silicon-on-insulator (SOI) structure, the counter electrode is also isolated by insulation and, therefore, no disadvantage arises when the counter electrode is connected to the oscillation inverter 3.

As pointed out earlier, moreover, it is also possible in the first embodiment of the temperature compensation type quartz oscillator shown in FIG. 1 to use an n-channel MOS resistor as the variable resistor for temperature compensation connected to the output terminal side of the oscillation inverter 3 and to make the connection with the power supply on the low-potential side.

Thus it is also possible to replace the temperature compensation fixed capacitor 15 with a temperature compensation fixed MOS capacitor whose gate electrode is an n-type polycrystalline silicon film and whose counter electrode is an n-type diffused region, connect the gate electrode thereof to the output terminal of the oscillation inverter 3, replace the external frequency control fixed capacitor 19 with an external frequency control fixed MOS capacitor whose gate electrode is a p-type polycrystalline silicon film and whose counter electrode is a p-type diffused region, and connect the gate electrode thereof to the input terminal of the oscillation inverter 3.

In such case, however, when a MOS capacitor which uses the counter electrode at a potential different from the power supply voltage is formed on an ordinary semiconductor substrate, however, the counter electrode must be electrically isolated from its surroundings by use of a pn junction. In the case of using an n-type semiconductor substrate, therefore, it is unavoidable to use a double diffusion structure for enclosing the periphery of the counter electrode of the temperature compensation fixed MOS capacitor with a p-type diffused region. On the other hand, in the case of using a p-type semiconductor substrate, it is unavoidable to use a double diffusion structure for enclosing the periphery of the counter electrode of the external frequency control fixed MOS capacitor with an n-type diffused region, which is disadvantageous in production.

Except in the case of forming the semiconductor integrated circuit using SOI structure, therefore, it is advantageous when a voltage-dependent MOS capacitor is used as the fixed capacitor to use a temperature compensation fixed MOS capacitor and an external frequency control fixed MOS capacitor that are MOS capacitors of the same type.

When the semiconductor integrated circuit is formed using SOI structure, the type of MOS capacitor is not restricted and only the manner of connection is restricted.

Another embodiment of this invention will now be described in detail.

[Second Embodiment]

Figure 5:
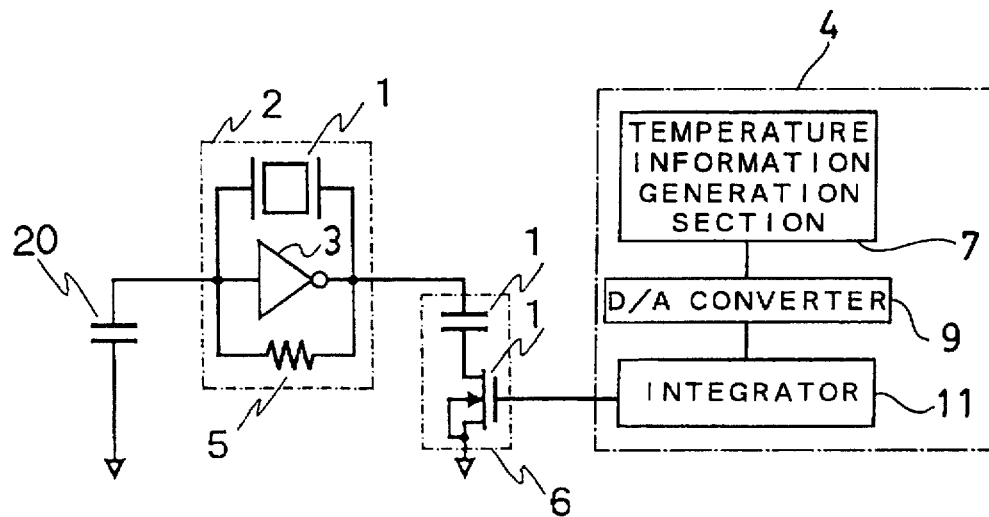
FIG. 5 is a circuit diagram showing the structure of a temperature compensation type quartz oscillator that is a second embodiment of the invention.

FIG. 5 is a circuit diagram showing the structure of a temperature compensation type quartz oscillator that is a second embodiment of this invention. In FIG. 5, the oscillation inverter and the like are designated using circuit symbols and the temperature information generation section and the like using blocks.

This second embodiment is also a digital temperature compensation type quartz oscillator with quartz oscillation means 2 constituted by connecting in parallel a quartz oscillator 1, an oscillation inverter 3 and a feedback resistor 5, and a temperature compensation control means 6 constituted by connecting in series a temperature compensation fixed capacitor 15 formed of two layers of polycrystalline silicon film containing high-concentration impurity and a temperature compensation MOS resistor 17 of n-channel MOS resistance type. The temperature compensation control means 6 is connected between the output terminal of the oscillation inverter 3, which constitutes one terminal of the quartz oscillation means 2, and the low-potential side power supply −Vcc.

4 is temperature compensation voltage generation means and is constituted of a temperature information generation section 7 for generating digital temperature compensation information, a voltage output type, D/A converter 9 for converting this digital temperature compensation information into an analog voltage, and an integrator 11 for preventing abrupt change in the output of the voltage output type D/A converter 9. This temperature compensation voltage generation means 4 outputs the output voltage of the voltage output type D/A converter 9 as a voltage for temperature compensation operation and the output terminal of thereof, i.e., the output terminal of the integrator 11, is connected to the gate, i.e. control terminal, of the temperature compensation MOS resistor 17.

A fixed capacitor 20 formed of two layers of polycrystalline silicon film containing high-concentration impurity is connected between the input terminal of the oscillation inverter 3, which constitutes the other terminal of the quartz oscillation means 2, and the low-potential side power supply −Vcc. No external frequency control means such as shown regarding the first embodiment is provided.

This is because the specifications of most portable telephones outside Japan do not include an operation at the call start time for setting the oscillating frequency of the temperature compensation type quartz oscillator to the reference frequency of the base station and, therefore, provision of an external frequency control means such as shown regarding the first embodiment is unnecessary in such digital temperature compensation type quartz oscillators for overseas use.

The capacitance value of the temperature compensation fixed capacitor 15 is around 30–50 pF or lower, as mentioned regarding the first embodiment.

The capacitance value of the fixed capacitor 20, while depending on the load capacitance for frequency regulation set at the time of manufacturing the quartz oscillator 1, is roughly 15–30 pF.

The temperature compensation fixed capacitor 15 and the fixed capacitor 20 can therefore easily be incorporated in a semiconductor integrated circuit.

Although both the temperature compensation fixed capacitor 15 and the fixed capacitor 20 are capacitors formed of two layers of polycrystalline silicon film containing high-concentration impurity, there can instead be used MOS capacitors having an arbitrary conductor such as polycrystalline silicon film, high-melting-point metal film, high-melting-point metal silicide film or the like as the gate electrode and a high-concentration diffused region as the counter electrode.

However, the counter electrode of the MOS capacitor used as the temperature compensation fixed capacitor 15 or the fixed capacitor 20 must be electrically isolated from its surroundings by use of a pn junction. Because of this, connecting this counter electrode to the oscillation inverter 3 involves the disadvantage of impairing the activation property. It is therefore better to connect the gate electrode to the oscillation inverter 3.

As was explained regarding the first embodiment, even in the case of using a capacitor with a voltage-dependent capacitance value as the temperature compensation fixed capacitor 15, the temperature compensation fixed capacitor can be considered to be a fixed capacitor so long as its capacitance value is not voltage dependent in the voltage range used. Therefore, even a MOS capacitor whose capacitance value is voltage dependent can be made usable as the temperature compensation fixed capacitor 15 in FIG. 5 through selection of the work function between the gate electrode and the substrate constituting its counter electrode, and the manner of connection thereof.

As shown in FIG. 4, a MOS capacitor whose gate electrode is an n-type polycrystalline silicon film and whose counter electrode is an n-type diffused region exhibits almost no capacitance value voltage dependence so long as the gate electrode is at a higher potential than the counter electrode and can be considered to be substantially a fixed capacitor so long as used under the condition of this potential relationship.

In the configuration of the digital temperature compensation type quartz oscillator shown in FIG. 5, the output terminal of the oscillation inverter 3 is constantly at a high potential relative to the temperature compensation MOS resistor 17 and, therefore, a MOS capacitor can be used as the temperature compensation fixed capacitor 15 by replacing the temperature compensation fixed capacitor 15 with a temperature compensation fixed MOS capacitor whose gate electrode is an n-type polycrystalline silicon film and whose counter electrode is an n-type diffused region and connecting the gate electrode to the output terminal of the oscillation inverter 3.

Otherwise, as is clear from FIG. 3, a MOS capacitor can be used as the temperature compensation fixed capacitor 15 by replacing the temperature compensation fixed capacitor 15 with a temperature compensation fixed MOS capacitor whose gate electrode is a p-type polycrystalline silicon film and whose counter electrode is a p-type diffused region and connecting the counter electrode thereof to the output terminal of the oscillation inverter 3.

By these ways it becomes possible to use a MOS capacitor, which is the highest in processing precision among the capacitors which can be incorporated in a semiconductor integrated circuit, as the temperature compensation fixed capacitor 15 in the temperature compensation type quartz oscillator according to this invention.

When a MOS capacitor which uses the counter electrode at a potential different from the power supply voltage is formed on an ordinary semiconductor substrate, however, the counter electrode must be electrically isolated from its surroundings by use of a pn junction. Since this results, for example, in the inclusion of extraneous floating capacitance known as pn-junction capacitance, connecting the counter electrode of a MOS capacitor to the output terminal of the oscillation inverter 3 degrades the oscillation activation property to below that in the case of connecting the gate electrode of the MOS capacitor to the output terminal of the oscillation inverter 3, and this and other problems lead to disadvantages in terms of performance.

In the case of a digital temperature compensation type quartz oscillator constituted with the temperature compensation fixed capacitor 15 and the temperature compensation MOS resistor 17 connected in series with the low-potential side power supply as shown in FIG. 5, therefore, it is advantageous when a MOS capacitor formed on an ordinary semiconductor substrate is used as the temperature compensation fixed capacitor 15 to use a MOS capacitor whose gate electrode is an n-type polycrystalline silicon film and whose counter electrode is an n-type diffused region.

When the semiconductor integrated circuit is formed using SOI, however, the type of MOS capacitor is not restricted. The only restriction in the case of forming the semiconductor integrated circuit using SOI is that the gate electrode and the counter electrode must be connected so as to obtain a potential relationship enabling the MOS capacitor to be considered substantially a fixed capacitor.

Although the temperature compensation control means 6 is connected to the output terminal side of the oscillation inverter 3 in the digital temperature compensation type quartz oscillator shown in FIG. 5, it can instead be connected to the input terminal side of the oscillation inverter 3.

When the temperature compensation control means 6 is connected to the input terminal side of the oscillation inverter 3, however, the variability range of the oscillating frequency becomes about half that when it is connected to the output terminal side of the oscillation inverter 3, as shown in FIG. 2. When it is connected to only one side, therefore, it is advantageous to connect it to the output terminal side of the oscillation inverter 3 as shown in FIG. 5.

The digital temperature compensation type quartz oscillator shown in FIG. 5 has the temperature compensation fixed capacitor 15 connected to the output terminal of the oscillation inverter 3 and the temperature compensation MOS resistor 17 connected to the low-potential side power supply. However, it is also possible to connect the drain of the temperature compensation MOS resistor 17 to the output terminal of the oscillation inverter 3, connect the temperature compensation fixed capacitor 15 to the source of the temperature compensation MOS resistor 17, and connect the other terminal of the temperature compensation fixed capacitor 15 to the low-potential side power supply.

Owing to the fact the drain of the temperature compensation MOS resistor 17 includes extraneous capacitance known as pn-junction capacitance as well as to other factors, however, degradation of oscillation activation property and other problems are more likely when the drain of the temperature compensation MOS resistor 17 is connected to the output terminal of the oscillation inverter 3 than when the temperature compensation fixed capacitor 15 is connected to the output terminal of the oscillation inverter 3.

Because of this, it is advantageous to connect the temperature compensation fixed capacitor 15 to the output terminal of the oscillation inverter 3 as shown in FIG. 5.

Also in the case of connecting the temperature compensation control means 6 to the input terminal of the oscillation inverter 3, it is similarly advantageous to connect the temperature compensation fixed capacitor 15 to the input terminal of the oscillation inverter 3.

Although the temperature compensation control means 6 of the digital temperature compensation type quartz oscillator shown in FIG. 5 is connected between the output terminal of the oscillation inverter 3 and the low-potential side power source, it can instead be connected between the output terminal of the oscillation inverter 3 and the high-potential side power supply. In such case, however, it is advantageous to change the temperature compensation MOS resistor 17 to a p-channel MOS resistor in order to eliminate the influence of the back gate effect.

When a p-channel MOS resistor is used and connected to the high-potential side power supply, it is advantageous when a MOS capacitor formed on an ordinary semiconductor substrate is used as the temperature compensation fixed capacitor 15 to use a MOS capacitor whose gate electrode is a p-type polycrystalline silicon film and whose counter electrode is a p-type diffused region and to connect the gate electrode thereof to the oscillation inverter 3.

When the semiconductor integrated circuit is formed using SOI, however, the type of MOS capacitor is not restricted insofar as the gate electrode and the counter electrode are connected so as to obtain a potential relationship enabling the MOS capacitor to be considered substantially a fixed capacitor.

Not only can a MOS capacitor be used as the temperature compensation fixed capacitor 15 but the fixed capacitor 20 can also be a high processing precision MOS capacitor.

Just as it makes no difference whether the power supply to which the temperature compensation control means 6 is connected is on the high-potential side or the low-potential side, it similar makes no difference whether the power supply to which the fixed capacitor 20 is connected is on the high-potential side or the low-potential side.

Two types of MOS capacitor can be used as capacitors that are substantially fixed depending on the connection state of the gate electrode and the counter electrode: a MOS capacitor whose gate electrode is a p-type polycrystalline silicon film and whose counter electrode is a p-type diffused region and a MOS capacitor whose gate electrode is an n-type polycrystalline silicon film and whose counter electrode is an n-type diffused region.

A very large number of combinations is therefore possible depending on which type of MOS capacitor is used for the temperature compensation fixed capacitor 15 and the fixed capacitor 20 and which power supply they are connected to.

In those of the combinations in which the temperature compensation fixed capacitor 15 and the fixed capacitor 20 are different types of MOS capacitor and connected to the same power supply or in which the temperature compensation fixed capacitor 15 and the fixed capacitor 20 are the same type of MOS capacitor and connected to different power supplies, the counter electrode of one of the MOS capacitors is connected to the oscillation inverter 3. As pointed out earlier, this leads to impairment of oscillation activation property and other problems when the semiconductor integrated circuit is fabricated using an ordinary semiconductor substrate.

Further, when the temperature compensation fixed capacitor 15 and the fixed capacitor 20 are MOS capacitors of different types and connected to different power supplies, the problem of oscillation activation property impairment does not arise if the counter electrode of the MOS capacitor whose gate electrode is a p-type polycrystalline silicon film and whose counter electrode is a p-type diffused region is connected to the high-potential side power supply and the counter electrode of the MOS capacitor whose gate electrode is an n-type polycrystalline silicon film and whose counter electrode is an n-type diffused region is connected to the low-potential side power supply.

When the semiconductor integrated circuit is fabricated using an ordinary semiconductor substrate, however, it is necessary for imparting the desired potential to the counter electrode side to use a pn-junction for electrical isolation from the surroundings. A double diffusion structure must therefore inevitably be used around the counter electrode of one of the MOS capacitors, which is disadvantageous in production.

More specifically, when the semiconductor integrated circuit is fabricated using a p-type semiconductor substrate, the substrate is connected to the low-potential side power supply. Therefore, if the counter electrode of a MOS capacitor whose gate electrode is a p-type polycrystalline silicon film and whose counter electrode is a p-type diffused region is to be connected to the high-potential side power supply, the periphery of p-type diffused region constituting this counter electrode must be enclosed by an n-type diffused region, inevitably making it a double diffusion structure.

On the other hand, when the semiconductor integrated circuit is fabricated using an n-type semiconductor substrate, the substrate is connected to the high-potential side power supply. Therefore, if the counter electrode of a MOS capacitor whose gate electrode is an n-type polycrystalline silicon film and whose counter electrode is an n-type diffused region is to be connected to the low-potential side power supply, the periphery of the n-type diffused region constituting this counter electrode must be enclosed by a p-type diffused region, inevitably making it a double diffusion structure. Both cases are disadvantageous in production.

Thus only two options are available in the case of fabricating the semiconductor integrated circuit using an ordinary semiconductor substrate: either to use a MOS capacitor whose gate electrode is a p-type polycrystalline silicon film and whose counter electrode is a p-type diffused region as both the temperature compensation fixed capacitor 15 and the fixed capacitor 20 and connect the counter electrodes to the high-potential side power supply or to use a MOS capacitor whose gate electrode is an n-type polycrystalline silicon film and whose counter electrode is an n-type diffused region as both the temperature compensation fixed capacitor 15 and the fixed capacitor 20 and connect the counter electrodes to the low-potential side power supply.

When the semiconductor integrated circuit is fabricated using SOI structure, the MOS capacitors can be considered to be substantially fixed capacitors insofar as the gate electrodes and the counter electrodes are of the same conductivity type and the gate electrodes and the counter electrodes are connected such that no depletion layer is formed in the activated layer of the SOI. Since the relationship among the types and power supply connections of the MOS capacitors is therefore not subject to restriction, any arbitrary combination is possible.

Both the first embodiment and second embodiment described in the foregoing use a series connection of a fixed capacitor and a variable resistor and vary the load capacitance by varying the resistance value of the variable resistor without varying the capacitance value itself.

[Third Embodiment]

Figure 6:
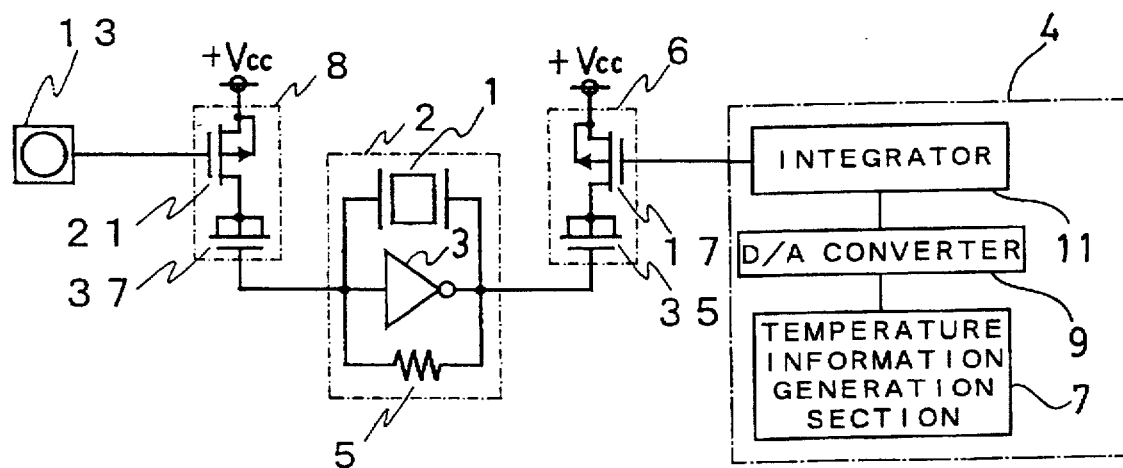
FIG. 6 is a circuit diagram showing the structure of a temperature compensation type quartz oscillator that is a third embodiment of the invention.

A third embodiment of the invention is explained next. FIG. 6 is a circuit diagram showing the structure of the third embodiment of the temperature compensation type quartz oscillator. In FIG. 6, the oscillation inverter and the like are designated using circuit symbols and the temperature information generation section and the like using blocks.

This third embodiment is also a digital temperature compensation type quartz oscillator which, like the preceding embodiments, is configured with quartz oscillation means 2 constituted by connecting in parallel a quartz oscillator 1, an oscillation inverter 3 and a feedback resistor 5.

In addition, temperature compensation control means 6 is constituted by connecting in series a temperature compensation variable MOS capacitor 35 whose gate electrode is an n-type polycrystalline silicon film and whose counter electrode is a p-type diffused region and a temperature compensation MOS resistor 17 of p-channel MOS resistance type. The temperature compensation control means 6 is connected between the output terminal of the oscillation inverter 3, which constitutes one terminal of the quartz oscillation means 2, and the high-potential side power supply +Vcc so that the temperature compensation MOS resistor 17 is on the power supply side.

External frequency control means 8 is constituted by connecting in series an external frequency control variable MOS capacitor 37 whose gate electrode is an n-type polycrystalline silicon film and whose counter electrode is a p-type diffused region and an external frequency control MOS resistor 21 of p-channel MOS resistance type. The external frequency control means 8 is connected between the input terminal of the oscillation inverter 3, which constitutes the other terminal of the quartz oscillation means 2, and the high-potential side power supply +Vcc so that the external frequency control MOS resistor 21 is on the power supply side.

4 is temperature compensation voltage generation means and is constituted of a temperature information generation section 7 for generating digital temperature compensation information, a voltage output type D/A converter 9 for converting this digital temperature compensation information into an analog voltage, and an integrator 11 for preventing abrupt change in the output of the voltage output type D/A converter 9. This temperature compensation voltage generation means 4 outputs the output voltage of the voltage output type D/A converter 9 as a voltage for temperature compensation operation and the output terminal of thereof, i.e., the output terminal of the integrator, is connected to the gate, i.e. control terminal, of the temperature compensation MOS resistor 17.

The gate, i.e., control terminal, of the external frequency control MOS resistor 21 is connected to an external voltage input terminal 13.

As was explained regarding the first embodiment, using the gate voltage of the temperature compensation MOS resistor 17 to vary the resistance value thereof is electrically equivalent to varying the capacitance value connected to the output terminal of the oscillation inverter 3 and enables the load capacitance to be varied to temperature-compensate the oscillating frequency.

Also as in the first embodiment, using the gate voltage of the external frequency control MOS resistor 21 to vary the resistance value thereof is electrically equivalent to varying the capacitance value connected to the input terminal of the oscillation inverter 3 and enables the load capacitance to be varied to set the oscillating frequency to the reference frequency of a base station.

The point in which this third embodiment differs from the first embodiment is that the capacitors connected in series with the variable resistors are not fixed capacitors but variable capacitors.

Both the temperature compensation variable MOS capacitor 35 and the external frequency control variable MOS capacitor 37 have gate electrodes formed of n-type polycrystalline silicon films and counter electrodes formed of p-type diffused regions and have their gate electrode sides respectively connected to the output terminal and input terminal of the oscillation inverter 3.

The counter electrode of the temperature compensation variable MOS capacitor 35 is connected to the high-potential side power supply +Vcc through the temperature compensation MOS resistor 17 and the counter electrode of the external frequency control variable MOS capacitor 37 is connected to the high-potential side power supply +Vcc through the external frequency control MOS resistor 21.

Connection in this manner enables the range of load capacitance variability by the MOS resistor to be made larger than in the case of using fixed capacitors. This is explained in the following using the electrical properties of a MOS capacitor.

Figure 7:
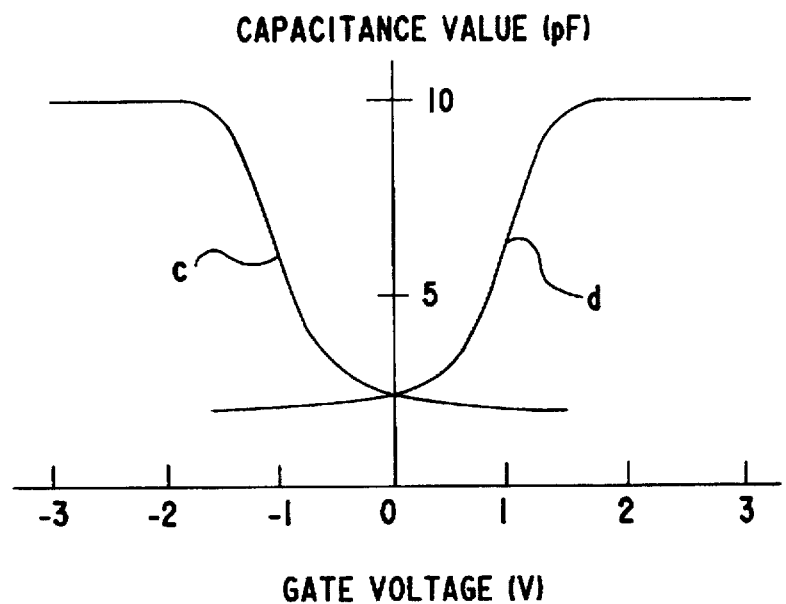
FIG. 7 is a graph showing the C-V characteristics of a MOS capacitor in still another embodiment of the invention.

FIG. 7 shows the relationship (the so-called C-V characteristics) between gate voltage and capacitance value, using the counter electrode as reference potential, in a MOS capacitor. FIG. 7 shows both the C-V characteristics c of a MOS capacitor whose gate electrode is an n-type polycrystalline silicon film and whose counter electrode is a p-type diffused region and the C-V characteristics d of a MOS capacitor whose gate electrode is a p-type polycrystalline silicon film and whose counter electrode is an n-type diffused region.

Although FIG. 7 is an example for the case of a measurement frequency of 1 MHz, these C-V characteristics do not change even when the frequency is in the 10 MHz band.

As shown in FIG. 7, the MOS capacitor whose gate electrode is an n-type polycrystalline silicon film and whose counter electrode is a p-type diffused region exhibits a large change in capacitance value in the vicinity of a gate voltage relative to the counter electrode of minus 0.5–2 V. The MOS capacitor whose gate electrode is a p-type polycrystalline silicon film and whose counter electrode is an n-type diffused region exhibits a large change in capacitance value in the vicinity of a gate voltage relative to the counter electrode of plus 0.5–2 V.

The capacitance value of a MOS capacitor whose gate electrode is an n-type polycrystalline silicon film and whose counter electrode is a p-type diffused region is maximum when the voltage of the gate electrode relative to the counter electrode is large in the negative direction and the capacitance value of a MOS capacitor whose gate electrode is a p-type polycrystalline silicon film and whose counter electrode is an n-type diffused region is maximum when the voltage of the gate electrode relative to the counter electrode is large in the positive direction.

Therefore, when a MOS capacitor whose gate electrode is an n-type polycrystalline silicon film and whose counter electrode is a p-type diffused region is used in series connection with a MOS resistor and a large load capacitance is desired, the capacitance value is maximized by causing a large negative voltage to act on the gate electrode relative to the counter electrode. Conversely, when a small load capacitance is desired, it suffices to reduce the capacitance value by causing almost no voltage to act on the gate electrode relative to the counter electrode. In this manner it is possible to increase the load capacitance variability range over that in the case of using a fixed capacitor.

Similarly, when a MOS capacitor whose gate electrode is a p-type polycrystalline silicon film and whose counter electrode is an n-type diffused region is used in series connection with a MOS resistor and a large load capacitance is desired, the capacitance value is maximized by causing a large positive voltage to act on the gate electrode relative to the counter electrode. Conversely, when a small load capacitance is desired, it suffices to reduce the capacitance value by causing almost no voltage to act on the gate electrode relative to the counter electrode. In this manner, too, it is possible to increase the load capacitance variability range over that in the case of using a fixed capacitor.

In other words, at the time of varying the load capacitance with a MOS resistor, the load capacitance variability range can be increased over that in the case of connecting a fixed capacitor and a MOS resistor in series by simultaneously varying the voltage across the two electrodes of the MOS capacitor and also matching the direction of the change in capacitance value of the MOS capacitor caused by this voltage change with the direction of the change in the load capacitance.

This is reduced to a concrete example in the third embodiment of the digital temperature compensation type quartz oscillator shown in FIG. 6.

Specifically, since the temperature compensation variable MOS capacitor 35 is a MOS capacitor whose gate electrode is an n-type polycrystalline silicon film, whose counter electrode is a p-type diffused region, whose gate electrode is connected to the output terminal of the oscillation inverter 3 and whose counter electrode is connected to the high-potential side power supply +Vcc through the temperature compensation MOS resistor 17, the potential of the gate electrode of the temperature compensation variable MOS capacitor 35 is never higher than the potential of the counter electrode.

Because of this, the change of its capacitance value with voltage is on the negative gate voltage side of the C-V characteristic curve c shown in FIG. 7 for a MOS capacitor whose gate electrode is an n-type polycrystalline silicon film and whose counter electrode is a p-type diffused region, the connection being such that the capacitance value increases with increasing potential difference between the gate electrode and the counter electrode.

When the load capacitance is to be increased, the resistance value of the temperature compensation MOS resistor 17 is decreased. In such case, since the potential difference across the terminals of the temperature compensation MOS resistor 17 almost disappears, almost all of the voltage at the output terminal of the oscillation inverter 3 acts on the temperature compensation variable MOS capacitor 35, causing the capacitance value of the temperature compensation variable MOS capacitor 35 to become maximum.

Conversely, when the load capacitance is to be decreased, the resistance value of the temperature compensation MOS resistor 17 is increased. In such case, since almost all of the voltage at the output terminal of the oscillation inverter 3 acts across the terminals of the temperature compensation MOS resistor 17, the potential difference across the two electrodes of the temperature compensation variable MOS capacitor 35 almost disappears and the capacitance value becomes minimum.

In other words, when the load capacitance is varied by the temperature compensation MOS resistor 17, the capacitance value of the temperature compensation variable MOS capacitor 35 is simultaneously varied and, moreover, the variations are made to coincide in direction. As a result, the range of load capacitance variability by the temperature compensation MOS resistor 17 can be made larger than in the case of using a fixed capacitor.

The foregoing explanation regarding the temperature compensation variable MOS capacitor 35 also similarly applies to the external frequency control variable MOS capacitor 37, and the range of load capacitance variability by the external frequency control MOS resistor 21 can be made larger than in the case of using a fixed capacitor.

Therefore, since use of a variable MOS capacitor can achieve the same range of load capacitance variability as use of a fixed capacitor while taking up a smaller area of the semiconductor integrated circuit, the digital temperature compensation type quartz oscillator shown in FIG. 6 enables everything but the quartz oscillator 1 to be readily incorporated in a semiconductor integrated circuit and, as such, is obviously able to achieve both more compact size and lower cost by reducing the number of components.

In the configuration of the third embodiment of the digital temperature compensation type quartz oscillator shown in FIG. 6, temperature compensation operation is conducted by the temperature compensation MOS resistor 17 on the output terminal side of the oscillation inverter 3 and the operation of setting the oscillating frequency to the reference frequency of a base station is conducted by the external frequency control MOS resistor 21 on the input terminal side of the oscillation inverter 3.

As pointed out regarding the first embodiment, the reason for this is that when a series connection of a variable MOS capacitor and a variable MOS resistor are used to conduct frequency control, the output terminal side of the oscillation inverter 3 has a broader range of frequency variability and is therefore used for the temperature compensation operation which requires a broad frequency variation range.

However, it is also possible, although somewhat disadvantageous, to use the input terminal side of the oscillation inverter 3 for temperature compensation operation and the output terminal side thereof for the operation of setting the oscillating frequency to the reference frequency of the base station.

Both the temperature compensation variable MOS capacitor 35 and the external frequency control variable MOS capacitor 37 of the digital temperature compensation type quartz oscillator shown in FIG. 6 are MOS capacitors having gate electrodes formed of n-type polycrystalline silicon films and counter electrodes formed of p-type diffused regions and having their gate electrodes respectively connected to the output terminal and input terminal of the quartz oscillation means 2. As is clear from FIG. 7, however, both can be MOS capacitors having gate electrodes formed of p-type polycrystalline silicon films and counter electrodes formed of n-type diffused regions and having their counter electrodes respectively connected to the output terminal and input terminal of the quartz oscillation means 2.

Although extraneous capacitance known as pn-junction capacitance is connected to the quartz oscillation means 2 in this case and this and other factors cause some amount of disadvantage regarding oscillation activation property, a configuration of this type possible.

Since, as pointed out regarding the first embodiment, the operation of setting the oscillating frequency to the reference frequency of the base station generally is subject to a designation that the frequency change is to be positive in polarity with respect to the external input voltage, the voltage controlled variable resistor used has to be one whose resistance value increases with increasing external input voltage.

Therefore, insofar as a MOS resistor is used as the voltage controlled variable resistor, the external frequency control MOS resistor 21 on the input terminal side of the oscillation inverter 3 must, as shown in FIG. 6, be a p-channel MOS resistor and cannot be an n-channel MOS resistor. If it is a p-channel MOS resistor, the resistance value increases and the effective load capacitance decreases with increasing external input voltage. Since the oscillating frequency therefore rises, the polarity of the operation is positive. On the other hand, in the case of temperature compensation operation, since the direction of oscillating frequency change with respect to change in the output voltage of the temperature compensation voltage generation means 4 can be arbitrarily set, the variable resistor connected to the output terminal side of the oscillation inverter 3 can be an n-channel MOS resistor.

In such case, however, it is advantageous to make the connection with the power supply on the low-potential side of in order to eliminate the influence of the back gate effect.

In other words, a configuration is possible in which the temperature compensation MOS resistor 17 is an n-channel MOS resistor connected to the low-potential side power supply and the external frequency control MOS resistor is a p-channel MOS resistor connected to the high-potential side power supply.

When the power supply connection is on the low-potential side, it is clear from FIG. 7 that it is necessary for the temperature compensation variable MOS capacitor 35 either to be a MOS capacitor whose gate electrode is an n-type polycrystalline silicon film, whose counter electrode is a p-type diffused region and whose counter electrode is connected to the output terminal of the oscillation inverter 3 or to be a MOS capacitor whose gate electrode is a p-type polycrystalline silicon film, whose counter electrode is an n-type diffused region and whose gate electrode is connected to the output terminal of the oscillation inverter 3.

Either configuration is possible in terms of operating principle. However, when different type MOS capacitors are to be used for the temperature compensation variable MOS capacitor 35 and the external frequency control variable MOS capacitor 37, the counter electrode of one of the MOS capacitors inevitably becomes a diffused region of the same conductivity type as the semiconductor substrate, and since this counter electrode must be imparted with a potential different from that of the semiconductor substrate, it is required to have a double diffusion structure for electrical isolation, which is disadvantageous in production.

On the other hand, when the same type of MOS capacitor is to be used for the temperature compensation variable MOS capacitor 35 and the external frequency control variable MOS capacitor 37, with the power supply connection of the temperature compensation variable MOS capacitor 35 made to the low-potential side and the power supply connection of the external frequency control variable MOS capacitor 37 made to the high-potential side, the counter electrode of one of the MOS capacitors has to be connected to the quartz oscillation means 2. While this causes some amount of disadvantage regarding oscillation activation property, it is superior from the practical aspect to using different types of MOS capacitor.

The digital temperature compensation type quartz oscillator shown in FIG. 6 has the temperature compensation variable MOS capacitor 35 and the external frequency control variable MOS capacitor 37 connected to the oscillation inverter 3 and the temperature compensation MOS resistor 17 and the external frequency control MOS resistor 21 connected to the high-potential side power supply +Vcc.

However, it is also possible to connect the drain of the temperature compensation MOS resistor 17 to the output terminal of the oscillation inverter 3, connect the drain of the external frequency control MOS resistor 21 to the input terminal of the oscillation inverter 3, connect the temperature compensation variable MOS capacitor 35 to the source of the temperature compensation MOS resistor 17, connect the external frequency control variable MOS capacitor 37 to the source of the external frequency control MOS resistor 21, and connect the other terminal of the temperature compensation variable MOS capacitor 35 and the other terminal of the external frequency control variable MOS capacitor 37 to the high-potential side power supply +Vcc.

However, the drains of the temperature compensation MOS resistor 17 and the external frequency control MOS resistor 21 include extraneous floating capacitance known as pn-junction capacitance. Therefore, degradation of oscillation activation property and other problems are more likely when the drains of the temperature compensation MOS resistor 17 and the external frequency control MOS resistor 21 are connected to the oscillation inverter 3 than when the temperature compensation variable MOS capacitor 35 and the external frequency control variable MOS capacitor 37 are connected to the oscillation inverter 3. Because of this, it is advantageous to connect the temperature compensation variable MOS capacitor 35 and the external frequency control variable MOS capacitor 37 to the oscillation inverter 3 as shown in FIG. 6.

Although the capacitors connected to the oscillation inverter 3 in the digital temperature compensation type quartz oscillator shown in FIG. 6 are both variable MOS capacitors whose gate electrodes are an n-type polycrystalline silicon film and whose counter electrodes are p-type diffused regions, no problem is caused by replacing the external frequency control variable MOS capacitor 37 connected to the input terminal of the oscillation inverter 3 with an external frequency control fixed capacitor formed of two layers of polycrystalline silicon film containing high-concentration impurity since the range of the frequency change required for the operation of setting the oscillating frequency to the reference frequency of the base station is not so large.

There is also no problem in replacing the external frequency control variable MOS capacitor 37 with an external frequency control fixed MOS capacitor whose gate electrode is an arbitrary conductor such as polycrystalline silicon film, high-melting-point metal film, high-melting-point metal silicide film or the like and whose counter electrode is a high-concentration diffused region, and connecting the gate electrode thereof to the input terminal of the oscillation inverter 3 and the counter electrode thereof to the high-potential side power supply +Vcc through the external frequency control MOS resistor 21.

Otherwise, as is clear from the C-V characteristics shown in FIG. 3, there is also no problem in replacing the external frequency control variable MOS capacitor 37 with an external frequency control fixed MOS capacitor whose gate electrode is a p-type polycrystalline silicon film and whose counter electrode is a p-type diffused region, and connecting the gate electrode thereof to the input terminal of the oscillation inverter 3 and the counter electrode thereof to the high-potential side power supply through the external frequency control MOS resistor 21.

[Fourth Embodiment]

Figure 8:
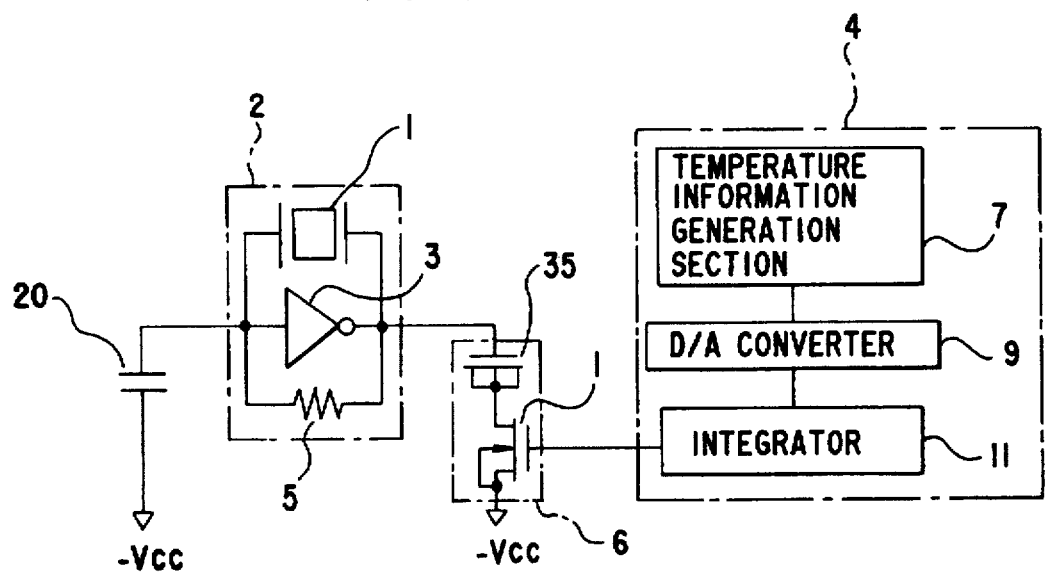
FIG. 8 is a circuit diagram showing the structure of a temperature compensation type quartz oscillator that is a fourth embodiment of the invention.

A fourth embodiment of the invention is explained next. FIG. 8 is a circuit diagram showing the structure of the temperature compensation type quartz oscillator. In FIG. 8, the oscillation inverter and the like are designated using circuit symbols and the temperature information generation section and the like using blocks.

The fourth embodiment shown in FIG. 8 is also a digital temperature compensation type quartz oscillator which is configured with quartz oscillation means 2 constituted by connecting in parallel a quartz oscillator 1, an oscillation inverter 3 and a feedback resistor 5.

In addition, temperature compensation control means 6 is constituted by connecting the counter electrode of a temperature compensation variable MOS capacitor 35 whose gate electrode is a p-type polycrystalline silicon film and whose counter electrode is an n-type diffused region to the drain of a temperature compensation MOS resistor 17 of n-channel MOS resistance type.

The gate electrode of the temperature compensation variable MOS capacitor 35 is connected to the output terminal of the oscillation inverter 3, which constitutes one terminal of the quartz oscillation means 2, and the source of the temperature compensation MOS resistor 17 and the substrate are connected to the low-potential side power supply −Vcc.

The temperature compensation voltage generation means 4 is constituted similarly to those of the earlier described embodiments and the output terminal of thereof, i.e., the output terminal of the integrator 11, is connected to the gate, i.e. control terminal, of the temperature compensation MOS resistor 17.

A fixed capacitor 20 formed of two layers of polycrystalline silicon film containing high-concentration impurity is connected between the input terminal of the oscillation inverter 3, which constitutes the other terminal of the quartz oscillation means 2, and the low-potential side power supply −Vcc.

As pointed out regarding the first embodiment, if the temperature compensation variable MOS capacitor 35 should be a fixed capacitor, the capacitance value required for temperature compensation would be around 30–50 pF or lower. It therefore occupies no more than roughly 200 μm×300 μm of surface area in the semiconductor integrated circuit.

As was explained regarding the third embodiment with reference to the C-V characteristics shown in FIG. 7, since the direction of the change in the load capacitance by the temperature compensation MOS resistor 17 and the direction of the change in the capacitance value of the temperature compensation variable MOS capacitor 35 are the same, the range of load capacitance variation by the temperature compensation MOS resistor 17 can be made larger than in the case of using a fixed capacitor so that the same range of load capacitance variability as in the case of a fixed capacitor can be achieved with a capacitor of smaller area.

The capacitance value of the fixed capacitor 20, while depending on the load capacitance for frequency regulation set at the time of manufacturing the quartz oscillator 1, is roughly 15–30 pF.

The temperature compensation variable MOS capacitor 35 and the fixed capacitor 20 can therefore easily be incorporated in a semiconductor integrated circuit.

Although the temperature compensation control means 6 is connected to the output terminal side of the oscillation inverter 3 in the digital temperature compensation type quartz oscillator shown in FIG. 8, it can instead be connected to the input terminal side of the oscillation inverter 3.

When the temperature compensation control means 6 is connected to the input terminal side of the oscillation inverter 3, however, the variability range of the oscillating frequency becomes about half that when it is connected to the output terminal side of the oscillation inverter 3, as shown in FIG. 2. When it is connected to only one side, therefore, it is advantageous to connect it to the output terminal side of the oscillation inverter 3 as shown in FIG. 8.

The digital temperature compensation type quartz oscillator shown in FIG. 8 has the temperature compensation variable MOS capacitor 35 connected to the output terminal of the oscillation inverter 3 and the temperature compensation MOS resistor 17 connected to the low-potential side power supply. However, it is also possible to connect the drain of the temperature compensation MOS resistor 17 to the output terminal of the oscillation inverter 3, connect the gate electrode of the temperature compensation variable MOS capacitor 35 to the source of the temperature compensation MOS resistor 17, and connect the counter electrode of the temperature compensation variable MOS capacitor 35 to the low-potential side power supply.

Owing to the fact that the drain of the temperature compensation MOS resistor 17 includes extraneous capacitance known as pn-junction capacitance as well as to other factors, however, degradation of oscillation activation property and other problems are more likely when the drain of the temperature compensation MOS resistor 17 is connected to the output terminal of the oscillation inverter 3 than when the temperature compensation variable MOS capacitor 35 is connected to the output terminal of the oscillation inverter 3.

Because of this, it is advantageous to connect the temperature compensation variable MOS capacitor 35 to the output terminal of the oscillation inverter 3 as shown in FIG. 8.

Also in the case of connecting the temperature compensation control means 6 to the input terminal of the oscillation inverter 3, it is similarly advantageous to connect the gate electrode of the temperature compensation variable MOS capacitor 35 to the input terminal of the oscillation inverter 3.

Although the temperature compensation control means 6 of this digital temperature compensation type quartz oscillator is connected between the output terminal of the oscillation inverter 3 and the low-potential side power source, it can instead be connected between the output terminal of the oscillation inverter 3 and the high-potential side power supply. In such case, however, it is advantageous to change the temperature compensation MOS resistor 17 to a p-channel MOS resistor in order to eliminate the influence of the back gate effect.

When a p-channel MOS resistor is used and connected to the high-potential side power supply, it is more advantageous to use a MOS capacitor whose gate electrode is an n-type polycrystalline silicon film and whose counter electrode is a p-type diffused region and to connect the gate electrode thereof to the oscillation inverter 3 than it is to use a MOS capacitor whose gate electrode is a p-type polycrystalline silicon film and whose counter electrode is an n-type diffused region and to connect the gate electrode thereof to the oscillation inverter 3.

This is because the counter electrode side of a MOS capacitor includes extraneous capacitance known as pn-junction capacitance and, owing to this and other factors, impairment of oscillation activation property and other disadvantages are more likely when the gate electrode of the MOS capacitor is connected to the oscillation inverter 3 than when the counter electrode is.

Although the fourth embodiment shown in FIG. 8 uses a capacitor formed of two layers of polycrystalline silicon film containing high-concentration impurity as the fixed capacitor 20, as pointed out regarding the second embodiment, it is also possible to use a high processing precision MOS capacitor as the fixed capacitor 20.

Among such MOS capacitors, the MOS capacitor whose counter electrode is a high-concentration diffused region is produced using a production step for the counter electrode thereof that is independent of the production step for the counter electrode of the temperature compensation variable MOS capacitor 35. Since these production steps therefore do not affect each other, the MOS capacitor requires no consideration regarding combination with the temperature compensation variable MOS capacitor 35 and, aside from the need to connect its gate electrode to the oscillation inverter 3 so as not to impair the oscillation activation property, it can be treated in the same way as a capacitor formed of two layers of polycrystalline silicon film containing high-concentration impurity.

Nevertheless, caution is required in combining a MOS capacitor whose gate electrode is a p-type polycrystalline silicon film and whose counter electrode is a p-type diffused region or a MOS capacitor whose gate electrode is an n-type polycrystalline silicon film and whose counter electrode is an n-type diffused region with the temperature compensation variable MOS capacitor 35 because the counter electrode thereof cannot in actual practice be formed independently of the counter electrode of the temperature compensation variable MOS capacitor 35.

In those of the combinations of the temperature compensation variable MOS capacitor 35 and the fixed capacitor 20 in which the counter electrodes of the temperature compensation variable MOS capacitor 35 and the fixed capacitor 20 are diffused regions of different conductivity types and connected to the same power supply or in which the counter electrodes of the temperature compensation variable MOS capacitor 35 and the fixed capacitor 20 are diffused regions of the same conductivity type and connected to different power supplies, the counter electrode of one of the MOS capacitors is connected to the oscillation inverter 3. As pointed out earlier, this leads to impairment of oscillation activation property and other problems when the semiconductor integrated circuit is fabricated using an ordinary semiconductor substrate.

Further, when the counter electrodes of the temperature compensation variable MOS capacitor 35 and the fixed capacitor 20 are diffused regions of different conductivity types and connected to different power supplies, the problem of oscillation activation property impairment does not arise if the counter electrode of the MOS capacitor whose counter electrode is a p-type diffused region is connected to the high-potential side power supply and the counter electrode of the MOS capacitor whose counter electrode is an n-type diffused region is connected to the low-potential side power supply.

When the semiconductor integrated circuit is fabricated using an ordinary semiconductor substrate, however, it is necessary for imparting the desired potential to the counter electrode side to use a pn-junction for electrical isolation from the surroundings. A double diffusion structure must therefore inevitably be used around the counter electrode of one of the MOS capacitors, which is disadvantageous in production.

More specifically, when the semiconductor integrated circuit is fabricated using a p-type semiconductor substrate, the substrate is connected to the low-potential side power supply. Therefore, if the counter electrode of a MOS capacitor whose counter electrode is a p-type diffused region is to be connected to the high-potential side power supply, the periphery of the p-type diffused region constituting this counter electrode must be enclosed by an n-type diffused region, inevitably making it a double diffusion structure.

On the other hand, when the semiconductor integrated circuit is fabricated using an n-type semiconductor substrate, the substrate is connected to the high-potential side power supply. Therefore, if the counter electrode of a MOS capacitor whose counter electrode is an n-type diffused region is to be connected to the low-potential side power supply, the periphery of n-type diffused region constituting this counter electrode must be enclosed by a p-type diffused region, inevitably making it a double diffusion structure. Both cases are disadvantageous in production.

Thus only two options are available in the case of fabricating the semiconductor integrated circuit using an ordinary semiconductor substrate. One is to use a MOS capacitor whose gate electrode is an n-type polycrystalline silicon film and whose counter electrode is a p-type diffused region as the temperature compensation variable MOS capacitor 35, use a MOS capacitor whose gate electrode is a p-type polycrystalline silicon film and whose counter electrode is a p-type diffused region as the fixed capacitor 20 and connect the counter electrodes to the high-potential side power supply. The other is to use a MOS capacitor whose gate electrode is a p-type polycrystalline silicon film and whose counter electrode is an n-type diffused region as the temperature compensation variable MOS capacitor 35, use a MOS capacitor whose gate electrode is an n-type polycrystalline silicon film and whose counter electrode is an n-type diffused region as the fixed capacitor 20 and connect the counter electrodes to the low-potential side power supply.

When a capacitor formed of two layers of polycrystalline silicon film containing high-concentration impurity or a MOS capacitor whose counter electrode is a high-concentration diffused region is used as the fixed capacitor 20, the power supply connection can be arbitrarily selected and caution is therefore needed only as regards the type and connection method of the temperature compensation variable MOS capacitor 35.

Both the third embodiment and fourth embodiments described in the foregoing use a series connection of a variable capacitor and a variable resistor and at the time of varying the resistance value of the variable resistor also simultaneously vary the capacitance value itself, thereby increasing the range of load capacitance variability.

[Fifth Embodiment]

Figure 9:
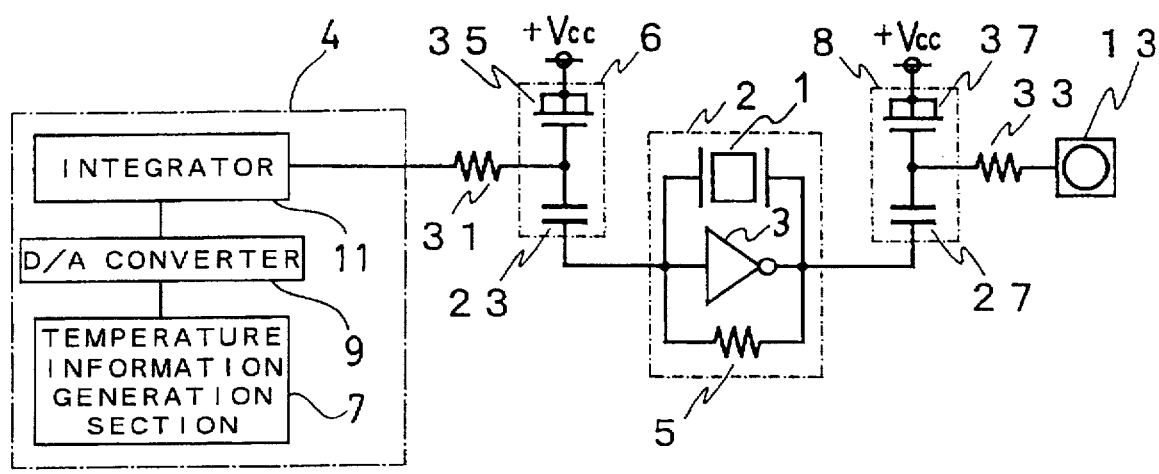
FIG. 9 is a circuit diagram showing the structure of a temperature compensation type quartz oscillator that is a fifth embodiment of the invention.

A fifth embodiment of the invention is explained next. FIG. 9 is a circuit diagram showing the structure of the fifth embodiment of the temperature compensation type quartz oscillator. In FIG. 9, the oscillation inverter and the like are designated using circuit symbols and the temperature information generation section and the like using blocks.

The embodiment shown in FIG. 9 is also a digital temperature compensation type quartz oscillator which, like the preceding embodiments, is configured with quartz oscillation means 2 constituted by connecting in parallel a quartz oscillator 1, an oscillation inverter 3 and a feedback resistor 5.

In addition, temperature compensation control means 6 is constituted by connecting in series a temperature compensation direct current blocking capacitor 23 formed of two layers of polycrystalline silicon film containing high-concentration impurity and a temperature compensation variable MOS capacitor 35 whose gate electrode is an n-type polycrystalline silicon film and whose counter electrode is a p-type diffused region.

The temperature compensation control means 6 is connected between the input terminal of the oscillation inverter 3, which constitutes one terminal of the quartz oscillation means 2, and the high-potential side power supply +Vcc so that the temperature compensation variable MOS capacitor 35 is on the power supply side.

External frequency control means 8 is constituted by connecting in series an external frequency control direct current blocking capacitor 27 formed of two layers of polycrystalline silicon film containing high-concentration impurity and an external frequency control variable MOS capacitor 37 whose gate electrode is an n-type polycrystalline silicon film and whose counter electrode is a p-type diffused region. The external frequency control means 8 is connected between the output terminal of the oscillation inverter 3, which constitutes the other terminal of the quartz oscillation means 2, and the high-potential side power supply +Vcc so that the external frequency control variable MOS capacitor 37 is on the power supply side.

Temperature compensation voltage generation means 4 is constituted in the same manner as in the preceding embodiments and its output terminal is connected through a temperature compensation fixed resistor 31 formed of polycrystalline silicon film to the connection point between the gate electrode of the temperature compensation variable MOS capacitor 35 and one terminal of the temperature compensation direct current blocking capacitor 23.

The gate electrode of the external frequency control variable MOS capacitor 37 is connected through an external frequency control fixed resistor 33 formed of polycrystalline silicon film to an external voltage input terminal 13 for setting the oscillating frequency to the reference frequency of a base station.

The counter electrodes of the temperature compensation variable MOS capacitor 35 and the external frequency control variable MOS capacitor 37 are connected to the high-potential side power supply +Vcc, while the temperature compensation voltage output by the temperature compensation voltage generation means 4 and the external input voltage applied from the external voltage input terminal 13 generally have the high-potential side power supply voltage as their upper limit and the low-potential side power supply voltage as their lower limit. As a result, the potentials of the gate electrodes of the temperature compensation variable MOS capacitor 35 and the external frequency control variable MOS capacitor 37 do not exceed the potential of the counter electrodes thereof.

To enable effective variation of the load capacitance under the condition of this potential relationship, both the temperature compensation variable MOS capacitor 35 and the external frequency control variable MOS capacitor 37 have gate electrodes formed of n-type polycrystalline silicon films and counter electrodes formed of p-type diffused regions. The reason for this is as follows.

As shown in FIG. 7, the capacitance value of a MOS capacitor whose gate electrode is an n-type polycrystalline silicon film and whose counter electrode is a p-type diffused region exhibits a large change in the vicinity of a gate voltage relative to the counter electrode of minus 0.5–2 V.

The load capacitance of the quartz oscillation means 2 can be therefore be varied and temperature compensation achieved by applying such a voltage to the gate electrode of the temperature compensation variable MOS capacitor 35 through the temperature compensation fixed resistor 31.

Further, the load capacitance of the quartz oscillation means 2 can be varied and frequency control from the outside achieved by applying such a voltage to the gate electrode of the external frequency control variable MOS capacitor 37 through the external frequency control fixed resistor 33.

Since the external frequency control variable MOS capacitor 37 has its counter electrode connected to the high-potential side power supply +Vcc and its gate electrode connected to the external voltage input terminal 13 through the external frequency control fixed resistor 33, moreover, its capacitance value decreases with increasing external input voltage, thereby increasing the frequency. Since the polarity of the variation is therefore positive, it is in line with prevailing specifications.

This is why the temperature compensation variable MOS capacitor 35 and the external frequency control variable MOS capacitor 37, which have their counter electrodes connected to the high-potential side power supply +Vcc, both have gate electrodes formed of n-type polycrystalline silicon films and counter electrodes formed of p-type diffused regions.

As shown in FIG. 7, the change in capacitance value of this type of MOS capacitor gives a minimum value that is about 20% of the maximum value.

Therefore, in the case of a MOS capacitor with a maximum capacitance value of 50 pF, for instance, the minimum capacitance value is about 10 pF, giving a difference of about 40 pF.

If the capacitance value of the temperature compensation direct current blocking capacitor 23 is adequately large and the temperature compensation variable MOS capacitor 35 exhibits a capacitance value change of about 40 pF, the oscillating frequency can be varied about 30–40 ppm. Insofar as an ordinary AT cut quartz oscillator is used as the quartz oscillator 1, therefore, the maximum capacitance value of the temperature compensation variable MOS capacitor 35 can be set to around 50 pF or lower.

A MOS capacitor of around this magnitude can be fabricated to occupy not more than 200 μm×300 μm of surface area in a semiconductor integrated circuit and can be readily incorporated in a semiconductor integrated circuit.

Since the range of oscillating frequency variation by the external voltage input terminal 13 is within 10 ppm, the external frequency control variable MOS capacitor 37 can be set to a maximum capacitance value of about 30 pF, notwithstanding that it is provided on the output terminal side of the oscillation inverter 3.

Therefore, the external frequency control variable MOS capacitor 37 can also be readily incorporated in a semiconductor integrated circuit.

Since the temperature compensation direct current blocking capacitor 23 and the external frequency control direct current blocking capacitor 27 are both sufficient at a capacitance value of around 50 pF, they can be constituted of two layers of polycrystalline silicon film to occupy not more than 200 μm×300 μm of surface area in a semiconductor integrated circuit. They too can therefore be readily incorporated in a semiconductor integrated circuit.

The temperature compensation fixed resistor 31 and the external frequency control fixed resistor 33 are both sufficient at a resistance value of about 100 kΩ or more. A resistor of this level can easily be formed using polycrystalline silicon film.

The temperature compensation fixed resistor 31 and the external frequency control fixed resistor 33 can also be formed as diffused resistors. Since pn junction is used for element isolation in the case of diffused resistors, however, leak current increases at high temperature, giving rise to the problem of subtly disturbing the potential of the gate electrode of the temperature compensation variable MOS capacitor 35 or the gate electrode of the external frequency control variable MOS capacitor 37. Polycrystalline silicon film resistors are therefore used in the fifth embodiment shown in FIG. 9.

The digital temperature compensation type quartz oscillator shown in FIG. 9 uses the input terminal side of the oscillation inverter 3 for temperature compensation operation and uses the output terminal side of the oscillation inverter 3 for the operation of setting the oscillating frequency to the reference frequency of the base station.

This is because the oscillating frequency variation is greater on the input terminal side of the oscillation inverter 3 than on the output terminal side thereof owing to the fact that this fifth embodiment of the digital temperature compensation type quartz oscillator uses the method of varying the load capacitance by directly varying the capacitance values of capacitors connected to the quartz oscillation means 2. However, the reverse is also possible.

In the reverse case, however, the maximum capacitance value of the temperature compensation variable MOS capacitor 35 and the capacitance value of the temperature compensation direct current blocking capacitor 23 must often be set to around 100 pF in order to secure a range of oscillating frequency variability of about 30–40 ppm. This is disadvantageous since it increases the area occupied in the semiconductor integrated circuit.

Since the gate electrode and the counter electrode of a MOS capacitor can each be either of two conductivity types, p type or n type, 4 types of MOS capacitor are possible by different combinations of gate electrode conductivity type and counter electrode conductivity type. However, since the polarity of frequency change relative to change in the external input voltage applied to the external voltage input terminal 13 has to be positive, each of the 4 types of MOS capacitor is limited to a single combination as regards which power supply the external frequency control variable MOS capacitor 37 is connected to and which electrode is connected to the power supply.

Specifically, it is clear from the C-V characteristics shown in FIGS. 3, 4 and 7 that a MOS capacitor whose gate electrode is an n-type polycrystalline silicon film and whose counter electrode is a p-type diffused region has to have its counter electrode connected to the high-potential side power supply, while a MOS capacitor whose gate electrode is a p-type polycrystalline silicon film and whose counter electrode is a p-type diffused region has to have its counter electrode connected to the low-potential side power supply. Further, a MOS capacitor whose gate electrode is a p-type polycrystalline silicon film and whose counter electrode is an n-type diffused region has to have its gate electrode connected to the high-potential side power supply, while a MOS capacitor whose gate electrode is an n-type polycrystalline silicon film and whose counter electrode is an n-type diffused region has to have its gate electrode connected to the low-potential side power supply.

In contrast, since it makes no difference whether the polarity of frequency change with respect to change in the output voltage of the temperature compensation voltage generation means 4 is positive or negative, two methods of connection are available for each type of MOS capacitor.

For instance, a MOS capacitor whose gate electrode is an n-type polycrystalline silicon film and whose counter electrode is a p-type diffused region or a MOS capacitor whose gate electrode is an n-type polycrystalline silicon film and whose counter electrode is an n-type diffused region can either have its gate electrode connected to the temperature compensation voltage generation means 4 through the temperature compensation fixed resistor 31 and its counter electrode connected to the high-potential side power supply or have its counter electrode connected to the temperature compensation voltage generation means 4 through the temperature compensation fixed resistor 31 and its gate electrode connected to the low-potential side power supply.

Further, a MOS capacitor whose gate electrode is a p-type polycrystalline silicon film and whose counter electrode is a p-type diffused region or a MOS capacitor whose gate electrode is a p-type polycrystalline silicon film and whose counter electrode is an n-type diffused region can either have its counter electrode connected to the temperature compensation voltage generation means 4 through the temperature compensation fixed resistor 31 and its gate electrode connected to the high-potential side power supply or have its gate electrode connected to the temperature compensation voltage generation means 4 through the temperature compensation fixed resistor 31 and its counter electrode connected to the low-potential side power supply.

The type and manner of connection of the temperature compensation variable MOS capacitor 35 can therefore be selected from among 8 combinations, while those of the external frequency control variable MOS capacitor 37 can be selected from among 4 combinations. Selection can therefore be made from among a total 32 combinations valid in terms of operating principle.

However, among these 32 combinations there are 16 in which the conductivity type of the counter electrode of the temperature compensation variable MOS capacitor 35 and the conductivity type of the counter electrode of the external frequency control variable MOS capacitor 37 are different, and in each of these combinations the periphery of one counter electrode must be enclosed by a diffused region of a different conductivity type, inevitably making it a double diffusion structure. Therefore, none of these 16 combinations is practical from the aspect of production cost.

Combinations which do not require a double diffusion structure despite difference in counter electrode conductivity type are limited to those in the case of connecting the counter electrode of a MOS capacitor whose counter electrode is an n-type diffused region to the high-potential side power supply and those in the case of connecting the counter electrode of a MOS capacitor whose counter electrode is a p-type diffused region to the low-potential side power supply.

The reason for this is that in the case of connecting the counter electrode of a MOS capacitor whose counter electrode is an n-type diffused region to the high-potential side power supply, no need to form an n-type diffused region arises if the semiconductor integrated circuit is formed on an n-type semiconductor substrate and the n-type semiconductor substrate is used as the counter electrode of this MOS capacitor, i.e., it suffices to form only the p-type diffused region constituting the counter electrode of the other MOS capacitor.

In the case of connecting the counter electrode of a MOS capacitor whose counter electrode is a p-type diffused region to the low-potential side power supply, no need to form a p-type diffused region arises if the semiconductor integrated circuit is formed on a p-type semiconductor substrate and the p-type semiconductor substrate is used as the counter electrode of this MOS capacitor, i.e., it suffices to form only the n-type diffused region constituting the counter electrode of the other MOS capacitor.

When the 16 combinations in which the conductivity type of the counter electrode of the temperature compensation variable MOS capacitor 35 and the conductivity type of the counter electrode of the external frequency control variable MOS capacitor 37 are different are considered in light of the foregoing condition, the number of practicable combinations not requiring a double diffusion structure is found to be 7.

In other words, when the external frequency control variable MOS capacitor 37 is a MOS capacitor whose gate electrode is a p-type polycrystalline silicon film and whose counter electrode is a p-type diffused region, the condition for not requiring a double diffusion structure in the external frequency control variable MOS capacitor 37 is met owing to the connection of the counter electrode to the low-potential side, and since the temperature compensation variable MOS capacitor 35 is not subject to restriction, it is possible to select from among 4 combinations. When the external frequency control variable MOS capacitor 37 is any of the remaining three types of MOS capacitor, however, only 1 combination can be selected for each type because of the need to satisfy the condition for not requiring a double diffusion structure in the temperature compensation variable MOS capacitor 35.

The total number of practicable combinations, including the 16 combinations in which the conductivity type of the counter electrode of the temperature compensation variable MOS capacitor 35 and the conductivity type of the counter electrode of the external frequency control variable MOS capacitor 37 are the same, is therefore 23.

Although the temperature compensation direct current blocking capacitor 23 and the external frequency control direct current blocking capacitor 27 are both capacitors formed of two layers of polycrystalline silicon film containing high-concentration impurity, these capacitors can of course be of any type insofar as their capacitance values are not voltage dependent in the voltage range used and, moreover, that they can be easily incorporated in a semiconductor integrated circuit.

Capacitors meeting these conditions include MOS capacitors having an arbitrary conductor such as polycrystalline silicon film, high-melting-point metal film, high-melting-point metal silicide film or the like as the gate electrode and a high-concentration diffused region as the counter electrode.

When the counter electrode is a high-concentration diffused region, almost no depletion layer is formed by the electric field from the gate electrode in the ordinarily used power supply voltage range and the capacitance value therefore does not depend on voltage.

This type of MOS capacitor can therefore be used as the temperature compensation direct current blocking capacitor 23 or the external frequency control direct current blocking capacitor 27 shown in FIG. 9.

However, the counter electrode of a MOS capacitor used as a direct current blocking capacitor must be electrically isolated from its surroundings by use of a pn junction. Because of this, connecting this counter electrode to the oscillation inverter 3 involves the disadvantage of impairing the activation property. It is therefore better to connect the gate electrode to the oscillation inverter.

The counter electrode consisting of a high-concentration diffused region can be easily formed by introducing high-concentration impurity under the gate insulating film.

For example, in the case of introducing boron as the high-concentration impurity, it suffices to conduct ion implantation after formation of the gate insulating film, while in the case of introducing phosphorus, arsenic or the like as the high-concentration impurity, it suffices to conduct ion implantation before formation of the gate insulating film.

The steps for producing such counter electrodes constituted of high-concentration diffused regions are independent of the production steps for the counter electrodes of the temperature compensation variable MOS capacitor 35 and the external frequency control variable MOS capacitor 37. Since these production steps therefore do not affect each other, it is possible, even when MOS capacitors whose counter electrodes are high-concentration diffused regions are used as the direct current blocking capacitors, to form the temperature compensation variable MOS capacitor 35 and the external frequency control variable MOS capacitor 37 to be exactly the same as in the case of using capacitors formed of two layers of polycrystalline silicon film.

When MOS capacitors whose counter electrodes are high-concentration diffused regions are used as the temperature compensation direct current blocking capacitor 23 and the external frequency control direct current blocking capacitor 27, the number of practicable combinations of the temperature compensation variable MOS capacitor 35 and the external frequency control variable MOS capacitor 37 is therefore also 23.

[Sixth Embodiment]

Figure 10:
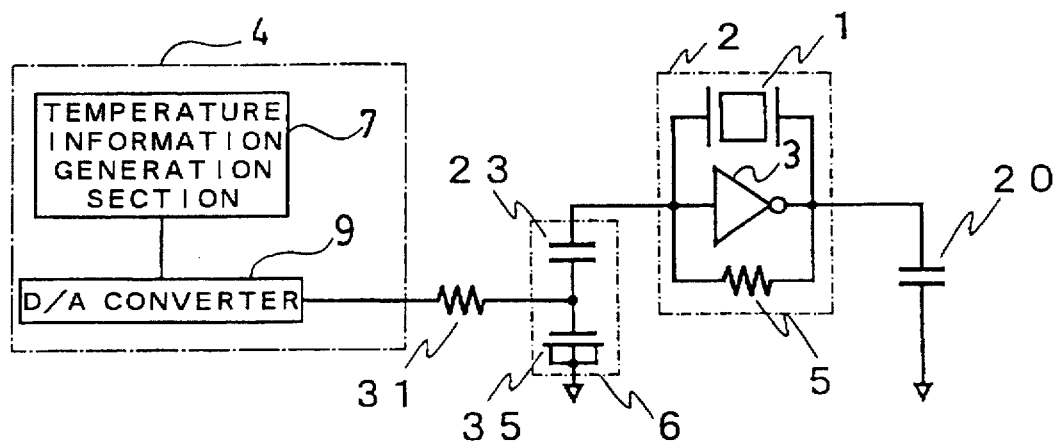
FIG. 10 is a circuit diagram showing the structure of a temperature compensation type quartz oscillator that is a sixth embodiment of the invention.

A sixth embodiment of the invention is explained next. FIG. 10 is a circuit diagram showing the structure of the sixth embodiment of the temperature compensation type quartz oscillator of the invention. In FIG. 10, the oscillation inverter and the like are designated using circuit symbols and the temperature information generation section and the like using blocks.

The sixth embodiment shown in FIG. 10 is also a digital temperature compensation type quartz oscillator which, like the preceding embodiments, is configured with quartz oscillation means 2 constituted by connecting in parallel a quartz oscillator 1, an oscillation inverter 3 and a feedback resistor 5.

In addition, temperature compensation control means 6 is constituted by connecting in series a temperature compensation direct current blocking capacitor 23 formed of two layers of polycrystalline silicon film containing high-concentration impurity and a temperature compensation variable MOS capacitor 35 whose gate electrode is a p-type polycrystalline silicon film and whose counter electrode is an n-type diffused region. The temperature compensation control means 6 is connected between the input terminal of the oscillation inverter 3, which constitutes one terminal of the quartz oscillation means 2, and the low-potential side power supply −Vcc so that the temperature compensation variable MOS capacitor 35 is on the power supply side.

A fixed capacitor 20 formed of two layers of polycrystalline silicon film containing high-concentration impurity is connected between the output terminal of the oscillation inverter 3, which constitutes the other terminal of the quartz oscillation means 2, and the low-potential side power supply −Vcc.

Temperature compensation voltage generation means 4 is constituted of a temperature information generation section 7 for generating digital temperature compensation information and a voltage output type D/A converter 9 for converting the digital temperature compensation information into an analog voltage.

This temperature compensation voltage generation means 4 outputs the output voltage of the voltage output type D/A converter 9 as a voltage for temperature compensation operation and the output terminal of thereof is connected to the gate of the temperature compensation variable MOS capacitor 35 through a temperature compensation fixed resistor 31 formed of polycrystalline silicon film.

The fact that the digital temperature compensation type quartz oscillator has no integrator between the voltage output type D/A converter 9 and the temperature compensation fixed resistor 31 is to indicate that an integrator is not required because the voltage output type D/A converter 9 of this embodiment is itself slow in operation so that its output does not change abruptly.

The counter electrode of the temperature compensation variable MOS capacitor 35 is connected to the low-potential side power supply −Vcc, while the temperature compensation voltage output by the temperature compensation voltage generation means 4 generally has the high-potential side power supply voltage as its upper limit and the low-potential side power supply voltage as its lower limit. As a result, the potential of the gate electrode of the temperature compensation variable MOS capacitor 35 is at or higher than the potential of the counter electrode thereof.

To enable effective variation of the load capacitance under the condition of this potential relationship, the temperature compensation variable MOS capacitor 35 has a gate electrode formed of an n-type polycrystalline silicon film and a counter electrode formed of a p-type diffused region. The reason for this is as set out regarding the fifth embodiment.

As also explained regarding the fifth embodiment, since the temperature compensation direct current blocking capacitor 23 and the temperature compensation variable MOS capacitor 35 are both sufficient at a capacitance value of around 50 pF, they can be readily incorporated in a semiconductor integrated circuit.

The capacitance value of the fixed capacitor 20, while depending on the load capacitance for frequency regulation set at the time of manufacturing the quartz oscillator 1, is roughly 15–30 pF.

The fixed capacitor 20 can therefore easily be incorporated in a semiconductor integrated circuit.

The temperature compensation fixed resistor 31 is sufficient at about 100 kΩ or more. A resistance of this level can easily be formed using polycrystalline silicon film.

The temperature compensation fixed resistor 31 can also be formed as a diffused resistor. Since pn junction is used for element isolation in the case of a diffused resistor, however, leak current increases at high temperature, giving rise to the problem of subtly disturbing the potential of the gate electrode of the temperature compensation variable MOS capacitor 35. A polycrystalline silicon film resistor is therefore used in the sixth embodiment shown in FIG. 10.

This sixth embodiment uses the input terminal side of the oscillation inverter 3 for temperature compensation operation. This is because the oscillating frequency variation is greater on the input terminal side of the oscillation inverter 3 than on the output terminal side thereof owing to the fact that the sixth embodiment of the digital temperature compensation type quartz oscillator shown in FIG. 10 uses the method of varying the load capacitance by directly varying the capacitance value of a capacitor connected to the quartz oscillation means 2. However, the reverse is also possible.

In the reverse case, however, the maximum capacitance value of the temperature compensation variable MOS capacitor 35 and the capacitance value of the temperature compensation direct current blocking capacitor 23 must often be set to around 100 pF in order to secure a range of oscillating frequency variability of about 30–40 ppm. This is disadvantageous since it increases the area occupied in the semiconductor integrated circuit.

Since the gate electrode and the counter electrode of a MOS capacitor can each be either of two conductivity types, p type or n type, 4 types of MOS capacitor are possible by different combinations of gate electrode conductivity type and counter electrode conductivity type.

Since it makes no difference whether the polarity of frequency change with respect to change in the output voltage of the temperature compensation voltage generation means 4 is positive or negative, two methods of connection are available for each type of MOS capacitor.

For instance, a MOS capacitor whose gate electrode is an n-type polycrystalline silicon film and whose counter electrode is a p-type diffused region or a MOS capacitor whose gate electrode is an n-type polycrystalline silicon film and whose counter electrode is an n-type diffused region can either have its gate electrode connected to the temperature compensation voltage generation means 4 through the temperature compensation fixed resistor 31 and its counter electrode connected to the high-potential side power supply or have its counter electrode connected to the temperature compensation voltage generation means 4 through the temperature compensation fixed resistor 31 and its gate electrode connected to the low-potential side power supply.

Further, a MOS capacitor whose gate electrode is a p-type polycrystalline silicon film and whose counter electrode is a p-type diffused region or a MOS capacitor whose gate electrode is a p-type polycrystalline silicon film and whose counter electrode is an n-type diffused region can either have its counter electrode connected to the temperature compensation voltage generation means 4 through the temperature compensation fixed resistor 31 and its gate electrode connected to the high-potential side power supply or have its gate electrode connected to the temperature compensation voltage generation means 4 through the temperature compensation fixed resistor 31 and its counter electrode connected to the low-potential side power supply.

The type and manner of connection of the temperature compensation variable MOS capacitor 35 can therefore be selected from among 8 combinations.

Although the temperature compensation direct current blocking capacitor 23 and the fixed capacitor 20 are both capacitors formed of two layers of polycrystalline silicon film containing high-concentration impurity, these capacitors can of course be of any type insofar as their capacitance values are not voltage dependent in the voltage range used and, moreover, that they can be easily incorporated in a semiconductor integrated circuit.

Capacitors meeting these conditions include MOS capacitors having an arbitrary conductor such as polycrystalline silicon film, high-melting-point metal film, high-melting-point metal silicide film or the like as the gate electrode and a high-concentration diffused region as the counter electrode.

When the counter electrode is a high-concentration diffused region, almost no depletion layer is formed by the electric field from the gate electrode in the ordinarily used power supply voltage range and the capacitance value therefore does not depend on voltage.

This type of MOS capacitor can therefore be used as the temperature compensation direct current blocking capacitor 23 or the fixed capacitor 20 shown in FIG. 10. However, the counter electrode of a MOS capacitor used as a direct current blocking capacitor must be electrically isolated from its surroundings by use of a pn junction. Because of this, connecting this counter electrode to the oscillation inverter 3 involves the disadvantage of impairing the activation property. It is therefore better to connect the gate electrode to the oscillation inverter 3.

Although the counter electrode of a MOS capacitor used as the fixed capacitor 20 does not necessarily have to be isolated from its surroundings, the counter electrode of such a MOS capacitor must be connected to the power supply, so that the electrode connected to the oscillation inverter 3 must be the gate electrode.

When a MOS capacitor whose counter electrode is electrically isolated from its surroundings using a pn junction is used as the fixed capacitor 20, it is of course advantageous to use the gate electrode thereof as the electrode connected to the oscillation inverter 3 so as not to impair the oscillation activation property.

The counter electrode consisting of a high-concentration diffused region can be easily formed by introducing high-concentration impurity under the gate insulating film.

For example, in the case of introducing boron as the high-concentration impurity, it suffices to conduct ion implantation after formation of the gate insulating film, while in the case of introducing phosphorus, arsenic or the like as the high-concentration impurity, it suffices to conduct ion implantation before formation of the gate insulating film.

The step for producing such a counter electrode constituted of a high-concentration diffused region is independent of the production step for the counter electrode of the temperature compensation variable MOS capacitor 35. Since these production steps therefore do not affect each other, it is possible, even when MOS capacitors whose counter electrodes are high-concentration diffused regions are used as the temperature compensation direct current blocking capacitor 23 or the fixed capacitor 20, to form the temperature compensation variable MOS capacitor 35 to be exactly the same as in the case of using capacitors formed of two layers of polycrystalline silicon film.

Therefore, the type and manner of connection of the temperature compensation variable MOS capacitor 35 can also be selected from among 8 combinations in the case where MOS capacitors whose counter electrodes are high-concentration diffused regions are used as the temperature compensation direct current blocking capacitor 23 and the fixed capacitor 20.

As explained regarding the second embodiment, even in the case of using a capacitor with a voltage-dependent capacitance value as the fixed capacitor 20, it can be considered to be a fixed capacitor so long as its capacitance value is not voltage dependent in the voltage range used. Therefore, even a MOS capacitor which is voltage dependent can be made usable as the fixed capacitor 20 in FIG. 10 through selection of the work function between the gate electrode and the substrate constituting its counter electrode, and the manner of connection thereof.

As shown in FIG. 4, a MOS capacitor whose gate electrode is an n-type polycrystalline silicon film and whose counter electrode is an n-type diffused region exhibits almost no capacitance value voltage dependence so long as the gate electrode is at a higher potential than the counter electrode and can be considered to be substantially a fixed capacitor so long as used under the condition of this potential relationship.

In the configuration of the digital temperature compensation type quartz oscillator shown in FIG. 10, the output terminal of the oscillation inverter 3 is constantly at a high potential relative to the fixed capacitor 20 and, therefore, a MOS capacitor exhibiting voltage dependence can be used as the fixed capacitor by replacing the fixed capacitor 20 with a fixed MOS capacitor whose gate electrode is an n-type polycrystalline silicon film and whose counter electrode is an n-type diffused region and connecting the gate electrode thereof to the output terminal of the oscillation inverter 3.

Otherwise, as is clear from FIG. 3, a MOS capacitor exhibiting voltage dependence can be used as the fixed capacitor by replacing the fixed capacitor 20 with a fixed MOS capacitor whose gate electrode is a p-type polycrystalline silicon film and whose counter electrode is a p-type diffused region and connecting the gate electrode thereof to the output terminal of the oscillation inverter 3 and connecting the counter electrode thereof to the high-potential side power supply.

Similarly to what was explained regarding the fifth embodiment, however, when one of these two types of voltage dependent MOS capacitor is used as a fixed capacitor, the only practicable combinations among the 4 combinations in which the conductivity type of the counter electrode of the fixed capacitor and the conductivity type of counter electrode of the temperature compensation variable MOS capacitor 35 are different are those which do not require a double diffusion structure. Therefore, only 1 combination can be selected for each type.

The number of combinations from among which selection is possible for each for the two types, including the 4 combinations for each in which the conductivity type of the counter electrode of the voltage dependent MOS capacitor is the same as the conductivity type of counter electrode of the temperature compensation variable MOS capacitor 35, is therefore 5.

To be specific, the four combinations with a temperature compensation variable MOS capacitor 35 whose counter electrode is an n-type diffusion region which are available in the case of using as the fixed capacitor 20 a MOS capacitor whose gate electrode is an n-type polycrystalline silicon film and whose counter electrode is an n-type diffused region and connecting the counter electrode thereof to the low-potential side power supply plus the combination available in the case of using a MOS capacitor whose gate electrode is a p-type polycrystalline silicon film and whose counter electrode is a p-type semiconductor substrate and connecting the counter electrode to the low-potential side power supply gives a total of 5 combinations from which to select.

Further, the four combinations with a temperature compensation variable MOS capacitor 35 whose counter electrode is a p-type diffusion region which are available in the case of using as the fixed capacitor 20 a MOS capacitor whose gate electrode is a p-type polycrystalline silicon film and whose counter electrode is a p-type diffused region and connecting the counter electrode thereof to the high-potential side power supply plus the combination available in the case of using a MOS capacitor whose gate electrode is an n-type polycrystalline silicon film and whose counter electrode is an n-type semiconductor substrate and connecting the counter electrode to the high-potential side power supply gives a total of 5 combinations from which to select.

Both the fifth embodiment and sixth embodiment explained in the foregoing use a series connection of a fixed direct current blocking capacitor and a variable capacitor and vary the load capacitance by varying the capacitance value of the variable capacitor.

[Other Modifications]

Although the invention has been specifically explained on the basis of embodiments, the invention is not limited to the aforementioned embodiments and, needless to say, can be modified in various ways without departing from the scope of the purport thereof.

For example, while as shown in FIGS. 1, 5, 6 and 8 the general practice is to use the gate of a MOS resistor as the resistance regulating terminal, the gate voltage can instead be made constant and the resistance value varied by using the back gate effect produced by varying the substrate potential.

Further, although as shown for example in FIGS. 1, 5, 6 and 8 a MOS resistor was used as the voltage controlled variable resistor, there can instead be used a combination of a junction field-effect transistor or bipolar transistor and a resistor.

In addition, although the MOS resistors and MOS capacitors are connected to the high-potential side power supply or the low-potential side power supply in the embodiments set out in the foregoing, since a digital temperature compensation type quartz oscillator ordinarily has a constant voltage generation means and uses the constant output thereof as a power supply, the MOS resistors and MOS capacitors can instead be connected to the constant potential output by the constant voltage generation means.

Further, while the quartz oscillation means is constituted of a quartz oscillator, an oscillation inverter and a feedback resistor in the embodiments set out in the foregoing, a bipolar transistor can be used in place of the oscillation inverter or multiple bipolar transistors can be used in totempole configuration.

INDUSTRIAL APPLICABILITY

Since the temperature compensation type quartz oscillator of this invention thus enables all components other than the quartz oscillator to be readily incorporated in a semiconductor integrated circuit, it can, by reducing the number of components, achieve a smaller, lower cost digital temperature compensation type quartz oscillator.

Moreover, when a configuration is adopted in which discrete MOS resistors are used as the variable resistors for temperature compensation and external frequency control, and the drains thereof are connected to capacitors, no direct current path is present in either the temperature compensation control means or the external frequency control means. The oscillating frequency can therefore be controlled without increasing current consumption in either control means.

In addition, when the gate of the temperature compensation MOS resistor is driven by the output voltage of a voltage output type D/A converter, no direct current path is present between the output of the D/A converter and the power supply. This point also enables control of the oscillating frequency without an extra increase in current consumption.

This invention is therefore highly effective when applied to various types of electronic equipment having built-in quartz oscillators and manifests outstanding effect when applied to the digital temperature compensation type quartz oscillators incorporated in portable telephone sets, which are subject to particularly severe demand for miniaturization.

What is claimed is:

1. A temperature compensation type quarts oscillator comprising:

quartz oscillation means, temperature compensation control means connected between one terminal of the quartz oscillation means and a power supply;

temperature compensation voltage generation means connected to a control terminal of the temperature compensation control means; and an external voltage input terminal connected to a control terminal of the external frequency control means, wherein the temperature compensation control means is constituted by connecting a variable capacitor for temperature compensation and a voltage controlled variable resistor for temperature compensation in series between one terminal of the quartz oscillation means and the power supply, the external frequency control means is constituted by connecting a fixed capacitor for external frequency control and a voltage controlled variable resistor for external frequency control in series between another terminal of the quartz oscillation means and the power supply, the temperature compensation voltage generation means outputs an output voltage of a voltage output type D/A converter as a temperature compensation voltage and applies the temperature compensation voltage to a control terminal of the temperature compensation variable resistor, and voltage input through the external input terminal is applied to a control terminal of the external frequency control variable resistor.

2. A temperature compensation type quartz oscillator according to claim 1, wherein the temperature compensation variable capacitor incorporated in the temperature compensation control means is a temperature compensation variable MOS capacitor, the temperature compensation variable resistor incorporated in the temperature compensation control means is a temperature compensation variable MOS resistor, the external frequency control variable resistor incorporated in the external frequency control means is an external frequency control variable MOS resistor, the temperature compensation voltage generated by the temperature compensation voltage generation means is applied to a control terminal of the temperature compensation variable MOS resistor, and voltage input through the external voltage input terminal is applied to a control terminal of the external frequency control variable MOS resistor.

3. A temperature compensation type quartz oscillator comprising:

quartz oscillation means;

temperature compensation control means connected between one terminal of the quartz oscillation means and a power supply;

temperature compensation voltage generation means connected to a control terminal of the temperature compensation control means; and an external voltage input terminal connected to a control terminal of the external frequency control means, wherein the temperature compensation control means is constituted by connecting a variable capacitor for temperature compensation and a voltage controlled variable resistor for temperature compensation in series between one terminal of the quartz oscillation means and the power supply, the external frequency control means is constituted by connecting a variable capacitor for external frequency control and a voltage controlled variable resistor for external frequency control in series between another terminal of the quartz oscillation means and the power supply, the temperature compensation voltage generation means outputs an output voltage of a voltage output type D/A converter as a temperature compensation voltage and applies the temperature compensation voltage to a control terminal of the temperature compensation variable resistor, and voltage input through the external voltage input terminal is applied to a control terminal of the external frequency control variable resistor.

4. A temperature compensation type quartz oscillator according to claim 3, wherein the temperature compensation variable capacitor incorporated in the temperature compensation control means is a temperature compensation variable MOS capacitor, the temperature compensation variable resistor incorporated in the temperature compensation control means is a temperature compensation variable MOS resistor, the external frequency control variable capacitor incorporated in the external frequency control means is an external frequency control variable MOS capacitor, the external frequency control variable resistor incorporated in the external frequency control means is an external frequency control variable MOS resistor, the temperature compensation voltage generated by the temperature compensation voltage generation means is applied to a control terminal of the temperature compensation variable MOS resistor, and voltage input through the external voltage input terminal is applied to a control terminal of the external frequency control variable MOS resistor.

5. A temperature compensation type quartz oscillator comprising:

quartz oscillation means;

temperature compensation control means constituted by connecting a direct current blocking capacitor for temperature compensation and a variable capacitor for temperature compensation in series between one terminal of the quartz oscillation means and a power supply;

external frequency control means constituted by connecting a direct current blocking capacitor for external frequency control and a variable capacitor for external frequency control in series between another terminal of the quartz oscillation means and the power supply;

temperature compensation voltage generation means which outputs an output voltage of a voltage output type D/A converter as a temperature compensation voltage and has its output terminal connected through a fixed resistor for temperature compensation to a connection point between the temperature compensation direct current blocking capacitor and the temperature compensation variable capacitor; and an external voltage input terminal connected through a fixed resistor for external frequency control to a connection point between the external frequency control direct current blocking capacitor and the external frequency control variable capacitor.

6. A temperature compensation type quartz oscillator according to claim 5, wherein the temperature compensation direct current blocking capacitor incorporated in the temperature compensation control means is a temperature compensation direct current blocking capacitor formed of two layers of polycrystalline silicon film containing high-concentration impurity, the temperature compensation variable capacitor incorporated in the temperature compensation control means is a temperature compensation variable MOS capacitor, the external frequency control direct current blocking capacitor incorporated in the external frequency control means is an external frequency control direct current blocking capacitor formed of two layers of polycrystalline silicon film containing high-concentration impurity, and the external frequency control variable capacitor incorporated in the external frequency control means is an external frequency control variable MOS capacitor.

7. A temperature compensation type quartz oscillator according to claim 5, wherein the temperature compensation direct current blocking capacitor incorporated in the temperature compensation control means is a temperature compensation direct current blocking capacitor whose counter electrode is a high-concentration diffused region, the temperature compensation variable capacitor incorporated in the temperature compensation control means is a temperature compensation variable MOS capacitor whose counter electrode is a low-concentration diffused region, the external frequency control direct current blocking capacitor incorporated in the external frequency control means is an external frequency control direct current blocking capacitor whose counter electrode is a high-concentration diffused region, and the external frequency control variable capacitor incorporated in the external frequency control means is an external frequency control variable MOS capacitor whose counter electrode is a low-concentration diffused region.

8. A temperature compensation type quartz oscillator comprising:

quartz oscillation means;

temperature compensation control means connected between one terminal of the quartz oscillation means and a power supply;

a fixed capacitor connected between another terminal of the quartz oscillation means and the power supply; and temperature compensation voltage generation means connected to a control terminal of the temperature compensation control means.

9. A temperature compensation type quartz oscillator according to claim 8, wherein the temperature compensation control means is constituted by connecting a variable capacitor for temperature compensation and a voltage controlled variable resistor for temperature compensation in series, and the temperature compensation voltage generation means is means which outputs the output voltage of a voltage output type D/A converter as a temperature compensation voltage and applies the temperature compensation voltage to a control terminal of the temperature compensation variable resistor.

10. A temperature compensation type quartz oscillator comprising:

quartz oscillation means;

temperature compensation control means constituted by connecting a temperature compensation direct current blocking capacitor and a temperature compensation variable capacitor in series between one terminal of the quartz oscillation means and a power supply;

a fixed capacitor connected between another terminal of the quartz oscillation means and the power supply; and temperature compensation voltage generation means which outputs an output voltage of a voltage output type D/A converter as a temperature compensation voltage and has its output terminal connected through a temperature compensation fixed resistor to a connection point between the temperature compensation direct current blocking capacitor and the temperature compensation variable capacitor.

11. A temperature compensation type quartz oscillator according to claim 10, wherein the temperature compensation direct current blocking capacitor incorporated in the temperature compensation control means is a temperature compensation direct current blocking capacitor formed of two layers of polycrystalline silicon film containing high-concentration impurity, the temperature compensation variable capacitor incorporated in the temperature compensation control means is a temperature compensation variable MOS capacitor, and the fixed capacitor connected between the other terminal of the quartz oscillation means and the power supply is a fixed capacitor formed of two layers of polycrystalline silicon film containing high-concentration impurity.

12. A temperature compensation type quartz oscillator according to claim 10, wherein the temperature compensation direct current blocking capacitor incorporated in the temperature compensation control means is a temperature compensation direct current blocking capacitor whose counter electrode is a high-concentration diffused region, the temperature compensation variable capacitor incorporated in the temperature compensation control means is a temperature compensation variable MOS capacitor whose counter electrode is a low-concentration diffused region, and the fixed capacitor connected between the other terminal of the quartz oscillation means and the power supply is a fixed MOS capacitor whose counter electrode is a high-concentration diffused region.

* * * * *